US010499475B2

(12) United States Patent
Tung et al.

(10) Patent No.: US 10,499,475 B2
(45) Date of Patent: Dec. 3, 2019

(54) LED DRIVER AND ILLUMINATION SYSTEM RELATED TO THE SAME

(71) Applicant: EPISTAR CORPORATION, Hsinchu (TW)

(72) Inventors: Chien-Kai Tung, Hsinchu (TW); Chang-Hsieh Wu, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/945,442

(22) Filed: Apr. 4, 2018

(65) Prior Publication Data

US 2018/0295683 A1 Oct. 11, 2018

(30) Foreign Application Priority Data

Apr. 5, 2017 (TW) .............................. 106111452 A

(51) Int. Cl.
| | |
|---|---|
| *H05B 33/08* | (2006.01) |
| *H02M 7/00* | (2006.01) |
| *H01L 29/417* | (2006.01) |
| *H01L 29/778* | (2006.01) |
| *H01L 29/861* | (2006.01) |
| *H01L 29/872* | (2006.01) |
| *H01L 29/20* | (2006.01) |
| *H01L 29/207* | (2006.01) |

(52) U.S. Cl.
CPC ..... *H05B 33/089* (2013.01); *H01L 29/41766* (2013.01); *H01L 29/7786* (2013.01); *H01L 29/861* (2013.01); *H01L 29/872* (2013.01); *H02M 7/003* (2013.01); *H05B 33/0824* (2013.01); *H01L 29/2003* (2013.01); *H01L 29/207* (2013.01); *H01L 29/7787* (2013.01); *H01L 29/8613* (2013.01)

(58) Field of Classification Search
CPC .. H05B 33/089; H05B 33/0824; H05B 37/02; H02M 7/003; H01L 29/7787; H01L 29/8613; H01L 29/207; H01L 29/2203; H01L 29/7786; H01L 29/861; H01L 29/872
USPC .... 315/151, 185 R, 224–226, 250, 291, 294, 315/307, 308, 312
See application file for complete search history.

(56) References Cited

U.S. PATENT DOCUMENTS

| | | |
|---|---|---|
| 6,219,263 B1 | 4/2001 | Wuidart |
| 8,304,916 B1 | 11/2012 | Sarkozy et al. |
| (Continued) | | |

*Primary Examiner* — Jimmy T Vu
(74) *Attorney, Agent, or Firm* — Ditthavong & Steiner, P.C.

(57) ABSTRACT

An LED driver for driving a light-emitting device (LED) includes a bridge rectifier, a current driver, and a protection circuit. The bridge rectifier includes a rectifying diode, and the bridge rectifier receives and converts an AC input power source to a DC power source having a DC current and a DC voltage. The current driver includes a constant current source. The bridge rectifier, the current driver, and the protection circuit are connected in series, and the constant current source is used to limit the magnitude of the direct current to drive the LED. The protection circuit includes a protection unit. The protection circuit connects the current driver and the LED. The LED includes a substrate and the rectifying diode, the constant current source, and the protection unit are formed together on the substrate.

14 Claims, 23 Drawing Sheets

(56) References Cited

U.S. PATENT DOCUMENTS

| | | | |
|---|---|---|---|
| 2012/0280247 A1 | 11/2012 | Cheah et al. | |
| 2014/0346954 A1* | 11/2014 | Li | H05B 33/0809 |
| | | | 315/121 |
| 2015/0382420 A1* | 12/2015 | Sakai | H05B 33/0803 |
| | | | 315/193 |
| 2016/0174318 A1* | 6/2016 | Mignano | H05B 33/0845 |
| | | | 315/201 |

* cited by examiner

LED DRIVER AND ILLUMINATION SYSTEM RELATED TO THE SAME

CROSS-REFERENCE TO RELATED APPLICATIONS

The present application claims the benefit of priority of Taiwanese Patent Application No. 106111452 filed on Apr. 5, 2017.

TECHNICAL FIELD

The present disclosure relates to an LED driver, in particular to an LED driver with a protection unit.

DESCRIPTION OF THE RELATED ART

Light-emitting diode (LED) are gradually replacing CCFL (Cold Cathode Fluorescent Lamp) or incandescent light bulbs to be the light source of back light or illumination systems because of great electro-optical conversion efficiency and the smaller product size. Due to the voltage-current characteristic of the LED, i.e. DC driving with about 3 volts), the general AC input power source cannot directly drive the LED. Therefore, a power converter for converting an AC input power source to a proper DC power source is needed.

The power consumed by lighting application needs is accounted for the majority of the mains electric supply so the power converter for lighting is regulated by law to provide low transition loss and good power factor, i.e. between 0 and 1. The electrical characteristic of an electronic device is more like a resistive load when its power factor is closer to 1.

FIG. 1 shows a conventional illumination system 10 including a bridge rectifier 12, a power factor corrector 14, an LED driver circuit 16, and an LED 18. The power factor corrector 14 can be a booster. The LED driver circuit 16 can be a buck converter. However, the switch-type power converter such as boost or a buck converter needs a bulky and expensive inductor, and the entire illumination system also needs many electrical components. Therefore, the illumination system including a switch-type power converter increases the cost and reduces the market competitiveness.

SUMMARY OF THE DISCLOSURE

An LED driver for driving a LED includes a bridge rectifier and a current driver. The bridge rectifier includes a rectifying diode and electrically connects to an AC input power source to produce a DC power source between a DC power line and a ground line. The current driver includes a constant current source. The constant current source and the LED are connected in series between the DC power line and the ground line. The constant current source provides a constant current to drive the LED. The LED driver includes a substrate and the rectifying diode and the constant current source are formed together on the substrate.

An LED driver for driving a LED includes a bridge rectifier, a current driver and a protection circuit. The bridge rectifier includes a rectifying diode, and the bridge rectifier receives and coverts an AC input power source to a DC power source having a DC current and a DC voltage. The current driver includes a constant current source, wherein the bridge rectifier, the current driver and the LED are connected in series, and the current driver limits the magnitude of the DC current to drive the LED. The protection circuit includes a protection unit, wherein the protection circuit connects the current driver and the LED. The LED driver includes a substrate, and the rectifying diode, the constant current source and the protection unit are formed together on the substrate.

DETAILED DESCRIPTION OF THE EMBODIMENTS

Throughout the present disclosure, the same symbols generally denote elements having the same or similar structures, functions and principles unless otherwise specified, and persons having ordinary knowledge in the art may infer the present invention from the teaching of the present disclosure. For the sake of conciseness of the description, the same symbols will not be repeated.

The LED illumination system disclosed in an embodiment of the present disclosure includes a concise circuit design. The main elements of the LED illumination system include an integrated circuit with a packaged single semiconductor chip, two capacitors and an LED as a lighting source. There is no need to connect to additional inductor for the LED illumination system in the embodiment. Therefore, the cost of the LED illumination system will be quite low. Besides, the LED illumination system provides good power factor which meets the requirements of most certifications.

Figure 1:
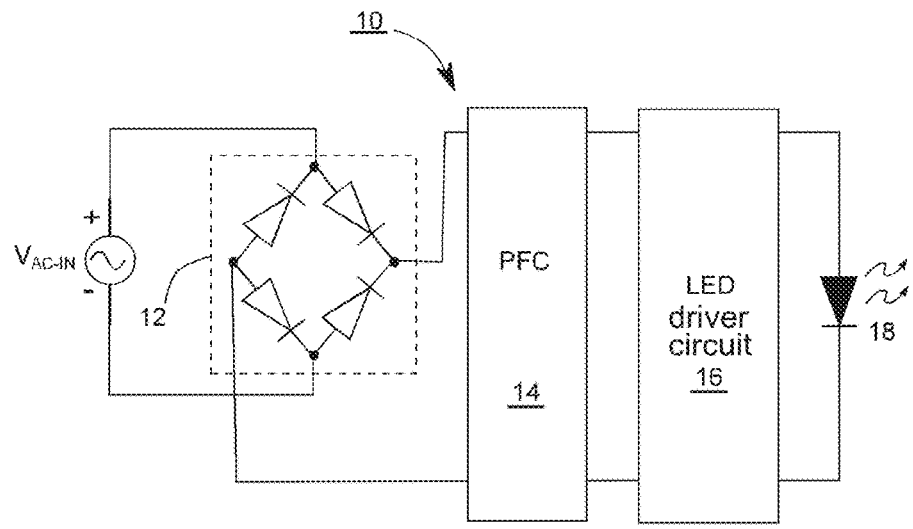
FIG. 1 shows a conventional illumination system.
Figure 2:
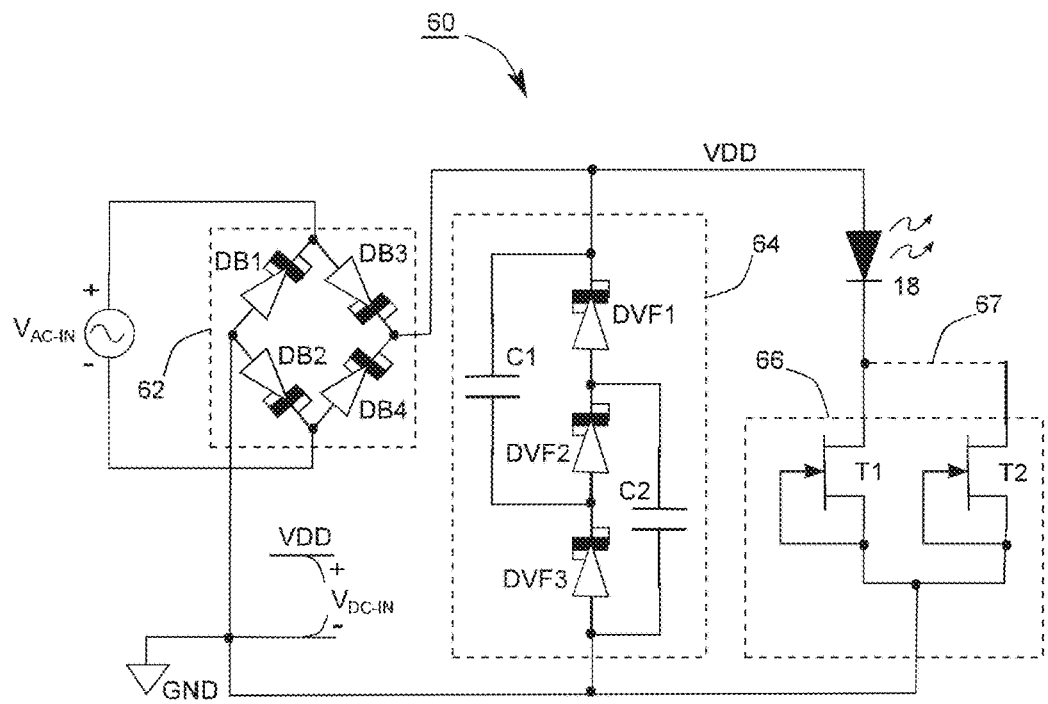
FIG. 2 shows an LED driver in accordance with an embodiment of the present disclosure.

FIG. 2 shows an LED driver 60 in accordance with an embodiment of the present disclosure, which is capable of driving an LED 18. The LED 18 can be a high-voltage LED consisting of multiple micro LEDs connected in series. For example, in an embodiment, the LED 18 consists of 10 or more micro LEDs connected in series, each of which includes a forward voltage about 3.4 V, and the equivalent forward voltage $V_{ef\text{-}led}$ of the LED 18 is about 50V.

The LED driver 60 includes three parts. The first part connected to an AC input power source $V_{AC\text{-}IN}$ is a bridge rectifier 62. The second part is a valley-fill circuit 64, functioned as a power factor corrector, to improve the power factor of the LED driver 60. The third part includes two high electron mobility transistors (HEMTs) T1 and T2, functioned as a current driver 66. The HEMTs T1 and T2 can be functioned as a constant current source respectively or connected together in parallel to be a constant current source providing larger current. Take the HEMT T1 as an example, while the drain-to-source voltage $V_{DS}$ is large enough, the drain-to-source current $I_{DS}$ from drain to source is substantially constant, which is barely changed with the voltage $V_{DS}$. So, the HEMT T1 substantially provides a constant current to drive the LED 18.

The bridge rectifier 62 includes four rectifying diodes DB1-DB4, and all of the four rectifying diodes can be Schottky diodes (SBDs). The bridge rectifier 62 rectifies the AC input power source to a DC power source between the DC power line VDD and the ground line GND. The AC input power source includes an alternating-current voltage $V_{AC\text{-}IN}$ and the DC power source includes a direct current $I_{DC\text{-}IN}$ and a direct-current voltage $V_{DC\text{-}IN}$. For example, the AC input power source can be 110V or 220V provided by alternating-current mains.

The valley-fill circuit 64 is connected to the DC power line VDD and the ground line GND and includes three diodes DVF1-DVF3 and capacitors C1, C2. The diodes DVF1-DVF3 are connected in reverse series between the DC power line VDD and the ground line GND. In the embodiment, the capacitances of the capacitors C1 and C2 are substantially equal but not limited thereto. Theoretically, the voltages $V_{C1}$ and $V_{C2}$ of the capacitors C1 and C2 can be charged to a magnitude equal to a half of the peak value $V_{PEAK}$ of the direct-current voltage $V_{DC\text{-}IN}$, i.e. $0.5*V_{PEAK}$. While the absolute magnitude of the alternating-current voltage $V_{AC\text{-}IN}$ is less than $0.5*V_{PEAK}$, the capacitors C1 and C2 charges the DC power line VDD and the ground line GND. Once the capacitances of the capacitors C1 and C2 are large enough, the minimum magnitude of the direct-current voltage $V_{DC\text{-}IN}$ can be maintained to be substantially equal to $0.5*V_{PEAK}$ by the valley-fill circuit 64 so as to provide sufficient voltage to turn on the LED 18.

The HEMTs T1 and T2 are depletion mode transistors, and the threshold voltages ($V_{TH}$) thereof are negative values. Each HEMT includes a gate and two channel electrodes, which are also referred to as source and drain. The gate and source of each of the HEMTs T1 and T2 are connected to each other. Take the HEMT T1 as an example, while the drain-to-source voltage $V_{DS}$ is large enough, the drain-to-source current $I_{DS}$ from drain to source is substantially constant, which is barely changed with the voltage $V_{DS}$. Therefore, each of the HEMTs T1 and T2 can be functioned as a constant current source to provide a constant current to drive the LED 18 and maintain the luminance thereof without flicker. In FIG. 2, the LED 18 is driven by the HEMT T1, and both the LED 18 and the HEMT T1 are regarded as a load, which are connected in series between the DC power line VDD and the ground line GND. As shown in FIG. 2, the HEMT T2 is connected to the LED 18 by a dashed line 67, which means the HEMT T2 can be optionally connected to the HEMT T1 to drive the LED 18 together, which will be illustrated in detail in the following paragraphs.

Figure 3:
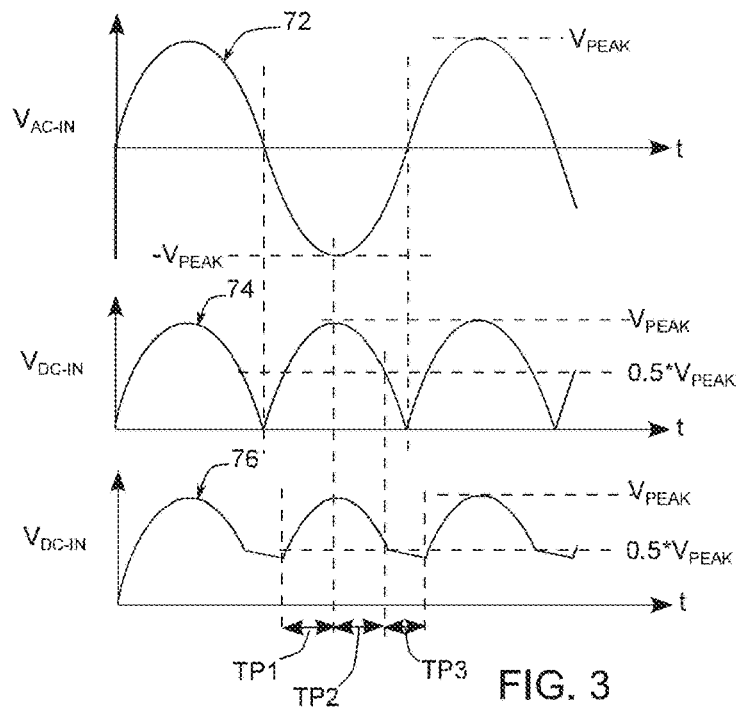
FIG. 3 shows voltage waveforms in accordance with an embodiment of the present disclosure.

FIG. 3 shows a time-varying voltage waveform 72 of the alternating-current voltage $V_{AC\text{-}IN}$ provided by the AC input power source, a time-varying voltage waveform 74 of the direct-current voltage $V_{DC\text{-}IN}$ provided by the DC power source without the valley-fill circuit 64, and a time-varying voltage waveform 76 of the direct-current voltage $V_{DC\text{-}IN}$ provided by the DC power source with the valley-fill circuit 64. For example, the waveform 72 of the alternating-current voltage $V_{AC-IN}$ is a sine wave with 220$V_{AC}$ as shown in FIG. 3. The voltage waveform 74 shows the simulation result without the valley-fill circuit 64. When no valley-fill circuit 64 is applied, the bridge rectifier 62 provides a concise full wave rectification to turn the negative part of the voltage waveform 72 into the positive part as the voltage waveform 74 shows. The valley-fill circuit 64 fills up the valley of the voltage waveform 74 or makes the valley of the voltage waveform 74 shallower as the voltage waveform 76 shows. For convenience of description, the following paragraphs describe the procedure of the circuit by means of the voltage waveform 74. For example, the situation where the voltage waveform 74 reaches the peak implies the voltage waveform 72 (the alternating-current voltage $V_{AC-IN}$) reaches the peak or the valley.

Period TP1 begins when the magnitude of the voltage waveform 74 is larger than that of the voltage waveform 76 and ends when the magnitude of the voltage waveform 74 reaches the peak value $V_{PEAK}$. During the period TP1, the power driving the LED 18 to emit light comes from the AC input power source so the voltage waveform 76 equals to the voltage waveform 74. At this moment, when the magnitude of the direct-current voltage $V_{DC-IN}$ is larger than the sum of the voltages $V_{C1}$ and $V_{C2}$ of the capacitors C1 and C2, the capacitors C1 and C2 are charged by the AC input power source. When the voltage waveform 74 reaches the peak value $V_{PEAK}$, the voltages $V_{C1}$ and $V_{C2}$ are substantially equal to $0.5*V_{PEAK}$.

Period TP2 begins when the magnitude of the voltage waveform 74 reaches the $V_{PEAK}$ and ends when the magnitude of the voltage waveform 74 decreased to the half of the $V_{PEAK}$, i.e. $\frac{1}{2}*V_{PEAK}$. During the period TP2, the magnitude of the voltage waveform 74 decreases by time and the power driving the LED 18 to emit light comes from the AC input power source, so the voltage waveform 76 equals to the voltage waveform 74. Because the capacitors C1 and C2 are not charged or discharged, the voltages $V_{C1}$ and $V_{C2}$ are maintained at $0.5*V_{PEAK}$.

Period TP3 begins when the magnitude of the voltage waveform 74 is lower than $0.5*V_{PEAK}$, which is substantially at time when the voltage waveform 74 reaches its valley. During the period TP3, the capacitor C1 discharges through the diode DVF3 to provide power to the HEMT T1 and the LED 18. Similarly, the capacitor C2 discharges through the diode DVF1 to provide power to the HEMT T1 and the LED 18. The voltages $V_{C1}$ and $V_{C2}$ are decreased by time, and the decreasing rate depends on the capacitances of the capacitors C1 and C2. The period TP3 ends when the value of the voltage waveform 74 is bounced back to be larger than the voltage $V_{C1}$ or $V_{C2}$. Then another period TP1 comes after the end of the period TP3. As shown in the voltage waveform 76 of FIG. 3, once the capacitances of the capacitors C1 and C2 are large enough, the DC power source is capable of providing the enough direct-current voltage $V_{DC-IN}$ to keep the LED 18 emit light.

As long as the capacitances of the capacitors C1 and C2 are large enough, the power factor adjusted by the valley-fill circuit 64 can meet the power factor requirements of most countries.

Figure 4A:
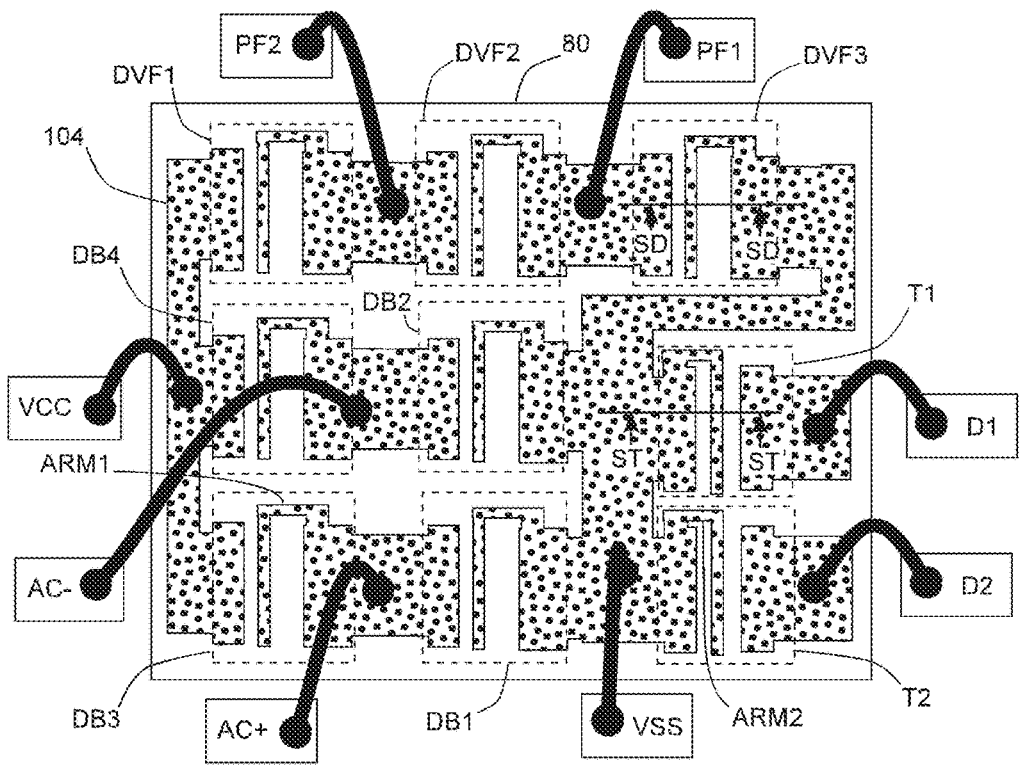
FIG. 4A shows a pattern of a metal layer on a semiconductor chip in accordance with an embodiment of the present disclosure.
Figure 5:
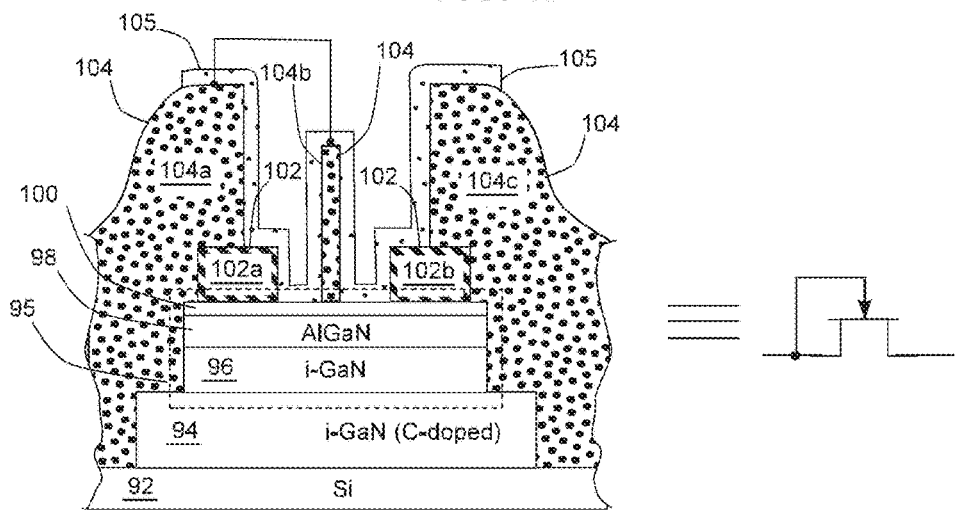
FIG. 5 shows a cross-sectional view of a HEMT T1 taken along the line ST-ST in FIG. 4A.
Figure 6:
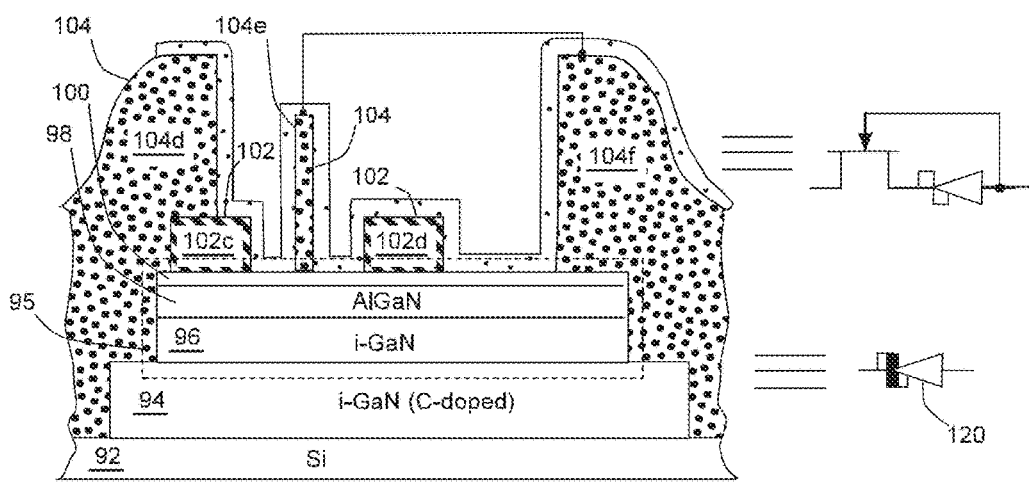
FIG. 6 shows a cross-sectional view of a diode DVF3 taken along the line SD-SD in FIG. 4A.

In an embodiment, the rectifying diodes DB1-DB4, the diodes DVF1-DVF3 and the HEMTs T1 and T2 in FIG. 2 are formed together on a single semiconductor chip. FIG. 4A shows a pattern of a metal layer 104 on a semiconductor chip 80, and the relative positions between the diodes and the HEMTs of FIG. 2 on the semiconductor chip 80. The semiconductor chip 80 can be a monolithic microwave integrated circuit (MMIC) with a GaN-based channel. In FIG. 4A, each of the diodes DVF1-DVF3 is a Schottky diode and has similar structure, and the HEMTs T1 and T2 both have similar structures. FIG. 5 shows a cross-sectional view of the HEMT T1 taken along the line ST-ST in FIG. 4A. FIG. 6 shows a cross-sectional view of the diode DVF3 taken along the line SD-SD in FIG. 4A. The structures of other diodes and HEMTs can be derived from these figures.

In the embodiment shown in FIG. 5, the material of the buffer layer 94 on the silicon substrate 92 can be carbon doped (C-doped) intrinsic GaN. The channel layer 96 can be made of intrinsic GaN and a high band-gap layer 98 is formed thereon, which can be made of intrinsic AlGaN. The cap layer 100 can be made of intrinsic GaN. The cap layer 100, the high band-gap layer 98, and the channel layer 96 are patterned to be a mesa 95. The two dimensional electron gas (2D-electron gas) as a conductive channel can be formed in the channel layer 96 adjacent to the quantum well of the high band-gap layer 98. The material of the patterned metal layer 102 can be titanium, aluminum or a stack thereof. As shown in FIG. 5, the metal layer 102 is formed to be two metal strips 102a and 102b on the mesa 95 as two ohmic contacts, and the metal strips 102a and 102b are functioned as a source and a drain of the HEMT T1 respectively. The material of the metal layer 104 can be titanium, gold or a stack thereof. For example, the metal layer 104 includes a nickel layer, a copper layer and a platinum layer from bottom to top. The platinum layer is used to increase the adhesion between the metal layer 104 and a protection layer 105 formed in the following steps and to prevent peeling issue while forming the bonding pad. In another embodiment, the metal layer 104 can be a stack of nickel layer, gold layer, and platinum layer or a stack of nickel layer, gold layer, and titanium layer. As shown in FIG. 5, the metal strips 104a, 104b, and 104c are formed by patterning the metal layer 104. The metal strip 104b forms a Schottky contact on the middle of mesa 95 to be a gate of the HEMT T1. The metal strips 104a and 104c, in FIG. 5, respectively contacts the metal strips 102a and 102b to provide an electrical connection between the source and the drain and other electrical components. Referring to FIG. 5 and FIG. 4A, the gate (i.e. the metal strip 104b) of the HEMT T1 is connected to the metal strip 104a and to the source of HEMT T1. The right part of FIG. 5 shows an equivalent circuit of the HEMT T1. The protection layer 105 is formed on the metal layer 104, and the material thereof can be silicon oxynitride (SiON). The protection layer 105 is patterned to form bonding pads for packaging. For example, in FIG. 5, the left part not covered by the protection layer 105 can be welded to a bonding wire connected to a low voltage pin VSS, which will be described in following paragraphs; while the right part not covered by the protection layer 105 can be welded to a bonding wire connected to a driving pin D1, which will be described in following paragraphs.

For brevity, the same or similar parts between FIG. 5 and FIG. 6 are not repeated. In FIG. 6, the metal layer 102 is formed to be two metal strips 102c and 102d on the mesa 95, and the metal strips 104d, 104e and 104f are formed by patterning the metal layer 104. Similar to FIG. 5, the metal strip 104e can be used as a gate of a HEMT. Though the metal strip 102d can be used as a source of the HEMT, the metal strip 102d does not contact with the metal layer 104. In another embodiment, the metal strip 102d can be omitted. The metal strip 104f contacts a portion of the top surface and a side wall of the mesa 95 to form another Schottky contact to be a Schottky diode whose cathode equivalently connected to the source of the HEMT in FIG. 6. Referring to FIG. 6 and FIG. 4A, the metal strip 104e, which is directly connected to the metal strip 104f, is used as an anode of the Schottky diode. The right part of FIG. 6 shows an equivalent circuit which is equivalent to a diode. The right part of FIG. 6 also shows a special diode symbol 120 to represent the equivalent circuit in FIG. 6. The diode symbol 120 is also used in FIG. 2 to represent the rectifying diodes DB1-DB4 and the diodes DVF1-DVF3, and each of the diodes is composed of a HEMT and a Schottky diode.

Figure 4B:
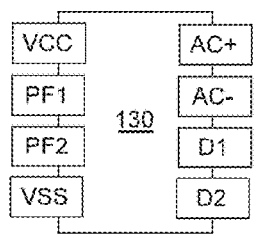
FIG. 4B shows a schematic view of a packaged semiconductor chip disclosed in FIG. 4A.

FIG. 4B shows an integrated circuit 130 formed by packaging the semiconductor chip 80. The integrated circuit 130 includes 8 pins, namely high voltage pin VCC, correction pins PF1 and PF2, low voltage pin VSS, AC input pins AC+ and AC−, and driving pins D1 and D2. Referring to FIG. 4A, the pins are electrically connected to the metal strips formed by patterning the metal layer 104 through bonding wires. Theses metal strips also provide connections between the corresponding input nodes and output nodes of electrical elements in the semiconductor chip 80. For example, the driving pin D1 is electrically connected to the drain of the HEMT T1, and the correction pin PF1 is electrically connected to the cathode of the diode DVF3.

Figure 7:
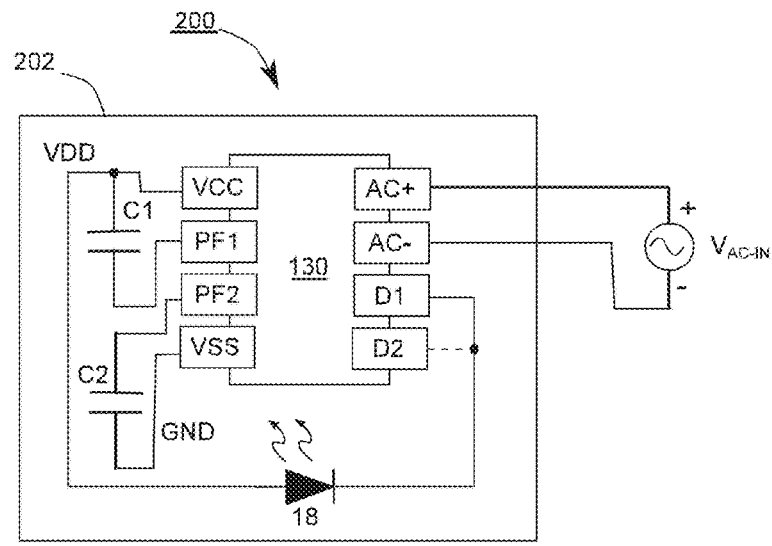
FIG. 7 shows an illumination system in accordance with another embodiment of the present disclosure.

FIG. 7 shows an illumination system 200 in accordance with the present disclosure. The integrated circuit 130 is mounted on a printed circuit board 202. Through the metal wires on the printed circuit board 202, the capacitor C1 electrically connects the high voltage pin VCC and the correction pin PF1, the capacitor C2 electrically connects the low voltage pin VSS and the correction pin PF2, the LED 18 electrically connects the high voltage pin VCC and the driving pin D1, and the AC input pins AC+ and AC− are connected to the AC input power source (the alternating-current voltage $V_{AC-IN}$). According to the above explanation, the illumination system 200 shown in FIG. 7 implements the LED driving circuit 60 disclosed in FIG. 2 by only four elements, including two capacitors C1 and C2, the integrated circuit 130, and an the LED 18. Without expensive and bulky inductance, the cost of the illumination system 200 can be reduced and the size of the total product can be downsized.

As shown in FIG. 7, the driving pin D2, electrically connected to the drain of HEMT T2, can be optionally connected to the LED 18 based on the magnitude of the alternating-current voltage $V_{AC-IN}$. In other words, the integrated circuit 130 can optionally use one HEMT T1 or two HEMTs T1 and T2 connected in parallel to drive the LED 18 to emit light. For example, the size of the HEMTs T1 and T2 are assumed to be the same, and each of the HEMTs T1 and T2 respectively provide the same constant current about 1 μA. When the AC input power source provides an alternating-current voltage, $110V_{AC}$, to the illumination system 200 in FIG. 7, an LED with a forward voltage value of 50V is chosen as the LED 18, and connected to the driving pins D1 and D2. Then, the power consumed by the LED 18 is about 100 μW (=2 μA*50V). When the AC input power source provides an alternating-current voltage, $220V_{AC}$, to the illumination system 200 in FIG. 7, an LED with a forward voltage value of 100V is chosen as the LED 18, and only connected to the driving pin D1 while the driving pin D2 is floating. Then, the power consumed by the LED 18 is about 100 μW (=1 μA*100V). Thus, although the magnitudes of the alternating-current voltages $V_{AC-IN}$ of the AC input power source are different, LEDs with different forward voltages can be chosen to be LED 18 to have the same power consumption (about 100 μW) so the light intensity provided by the illumination system 200 under different input voltages is substantially the same. In other words, the integrated circuit 130 is not only suitable for the AC input power source of $220V_{AC}$ but also suitable for AC input power source of $110V_{AC}$. This characteristic benefits the manufacturers of illumination system 200 because the cost of production control of illumination system 200 can be reduced.

Figure 8:
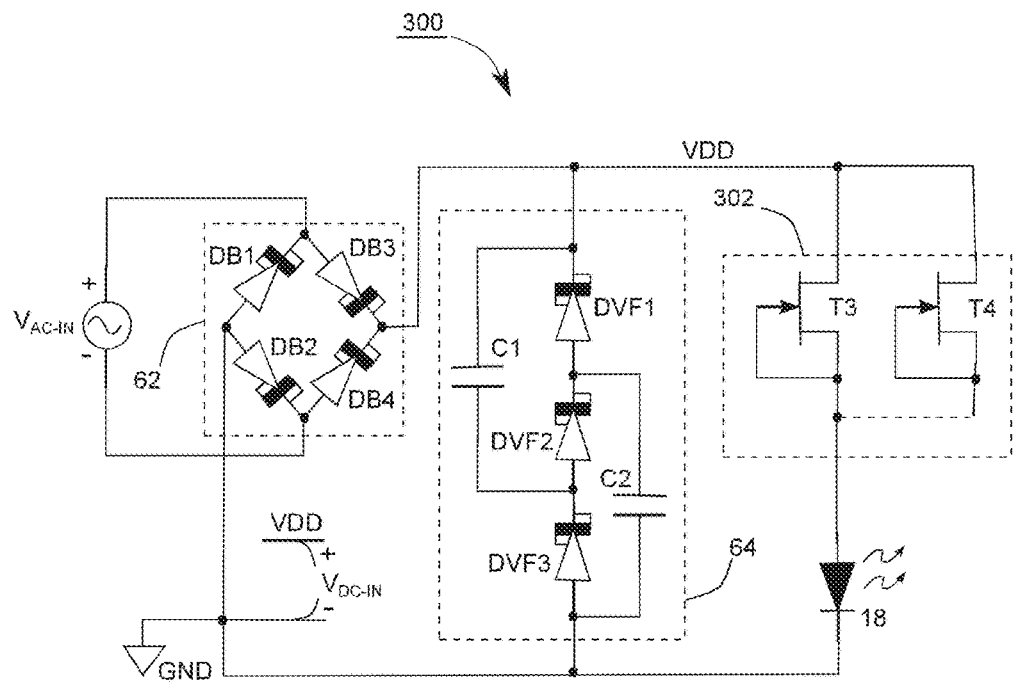
FIG. 8 shows an LED driver in accordance with another embodiment of the present disclosure.
Figure 9A:
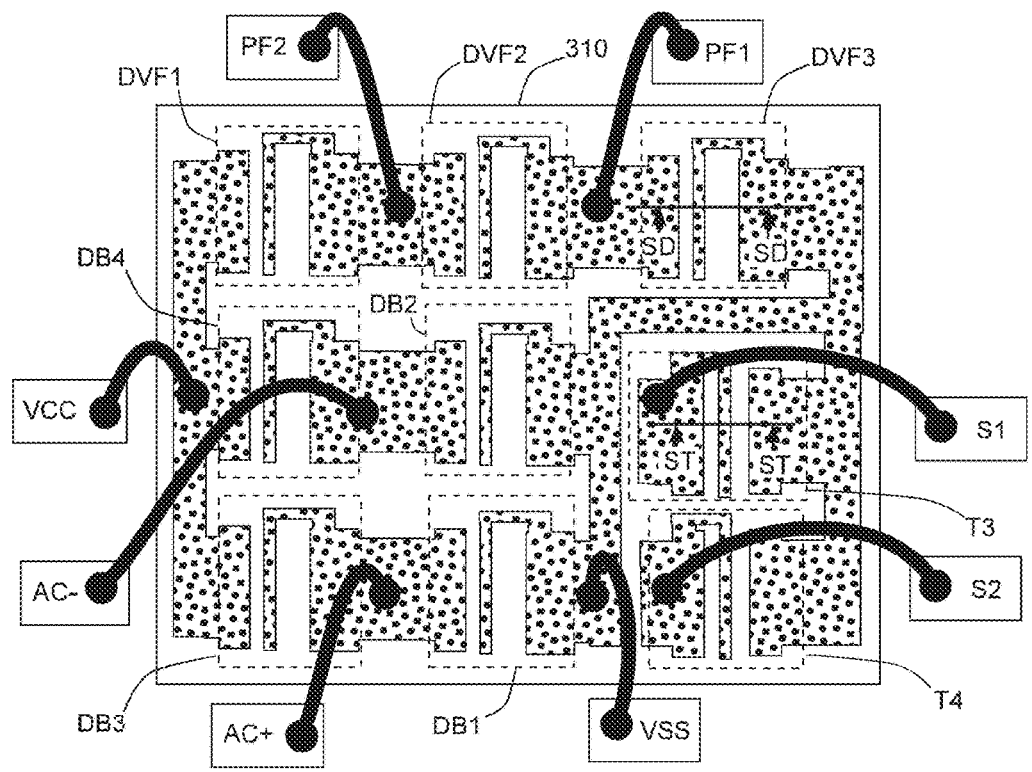
FIG. 9A shows a pattern of a metal layer on a semiconductor chip disclosed in another embodiment of the present disclosure.
Figure 9B:
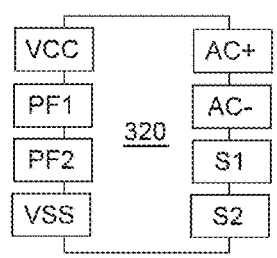
FIG. 9B shows a schematic view of a packaged semiconductor chip disclosed in FIG. 9A.
Figure 10:
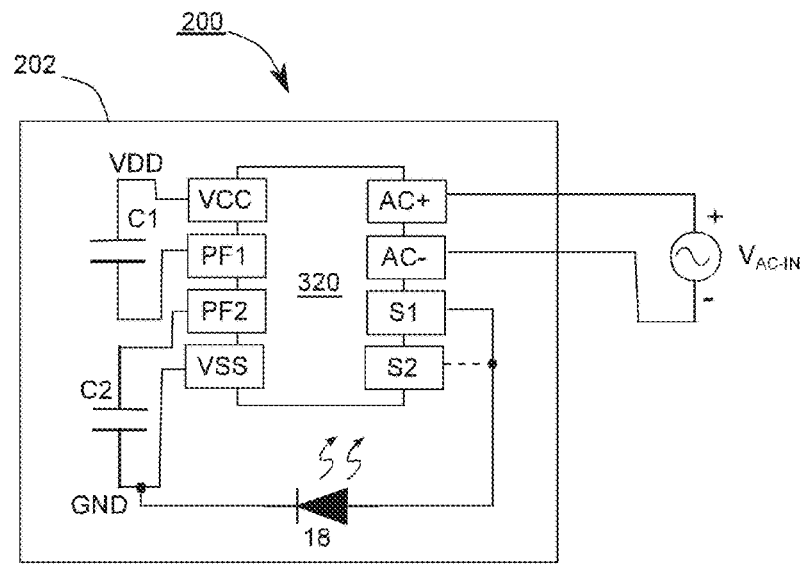
FIG. 10 shows an illumination system in accordance with another embodiment of the present disclosure.

As shown in FIG. 2, the current driver 66 connects the LED 18 and the ground line GND, but the present disclosure is not limited thereto. FIG. 8 shows an LED driver 300 in accordance with another embodiment of the present disclosure to drive the LED 18. The current driver 302 in FIG. 8 includes HEMTs T3 and T4. The drains of the HEMTs T3 and T4 are electrically connected to the DC power line VDD, and the LED 18 connects the ground line GND and the current driver 302. FIG. 9A shows a pattern of a metal layer 140 on a semiconductor chip 310 and the relative positions of the diodes and the HEMTs in FIG. 8. FIG. 5 also shows a cross-sectional view of the HEMT T3 taken along the line ST-ST in FIG. 9A. FIG. 6 also shows a cross-sectional view of the diode DVF3 taken along the line SD-SD in FIG. 9A. FIG. 9B shows an integrated circuit 320 including a packaged semiconductor chip 310. The integrated circuit 320 has 8 pins, namely high voltage pin VCC, correction pins PF1 and PF2, low voltage pin VSS, AC input pins AC+ and AC−, and driving pins D1 and D2. FIG. 10 shows another illumination system 330 in accordance with the present disclosure, wherein the illumination system 330 implements the LED driver 300 in FIG. 8. The description of FIGS. 8, 9A, 9B and 10 can be referred to the description related to FIGS. 2, 4A, 4B and 7 to realize the theory, operation and benefits, and are not repeated for brevity.

Figure 11:
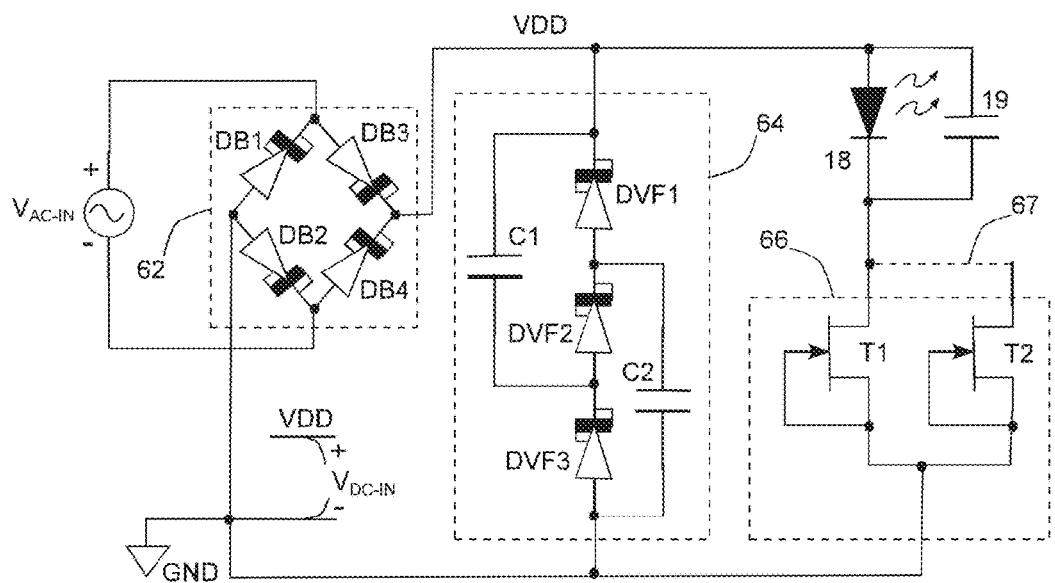
FIG. 11 shows a circuit of an LED and an additional capacitor connected in parallel.

As the embodiment shown in FIG. 11, an additional capacitor 19 for stabilizing the voltage is used to connect with the LED 18 in parallel. The capacitor 19 is used to reduce the variation of voltage applied on the LED 18 and even increase the duty cycle or light emitting time of the LED 18 within a period of the voltage provided by the AC input power source to eliminate the possibility of flickering of the LED 18.

Figure 12:
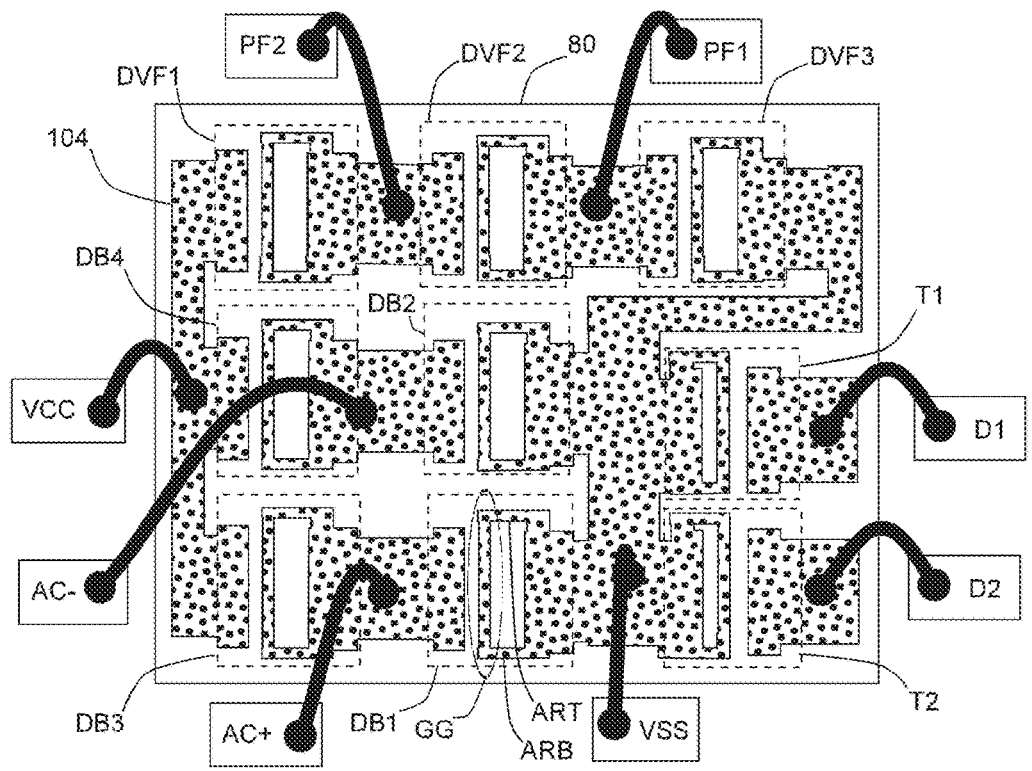
FIG. 12 shows a pattern of a metal layer on a semiconductor chip disclosed in another embodiment of the present disclosure.

The pattern in FIG. 4 demonstrates an embodiment and the presented disclosure is not limited thereto. FIG. 12 shows a pattern of metal layer 104 on another semiconductor chip. The pattern in FIG. 12 is similar to that in FIG. 4 so the same parts or similar parts therebetween are not repeated for brevity. In FIG. 4A, a gate located at the center of each diode connects to the anode of the diode only through an arm ARM 1 formed by patterning the metal layer 104, such as the metal strip 104f in FIG. 6. The gate located at the center of each HEMT also connects to its source through an arm ARM 2 formed by patterning the metal layer 104, such as the metal strip 104a in FIG. 5. As the gate area GG shown in FIG. 12, the gate located at the center of each diode connects to the anode of the diode through the arms ART and ARB formed by patterning the metal layer 104, and the gate located at the center of each HEMT also connects to its source through the arms formed by patterning the metal layer 104. Compared with the design in FIG. 4A, the arms of the diodes in FIG. 12 are more symmetrical in manufacturing so the structures of the arms are not easily compressed by other structures above and below the arms during the manufacturing, such as developing, exposure, epitaxial and etching. The widths of the arms are more uniform and the structures thereof are not likely to be broken or deformed. On the contrary, the structure in FIG. 4A includes only one arm so the width of the arm is prone to be uneven during manufacturing other parts. Such varied width is likely to induce breakdown due to crowding of high voltage or large current. Therefore, the structures in FIG. 12 provide a better breakdown voltage protection because the widths of the arms in FIG. 12 are more uniform and the structures thereof are not easily deformed by other structures.

Figure 13:
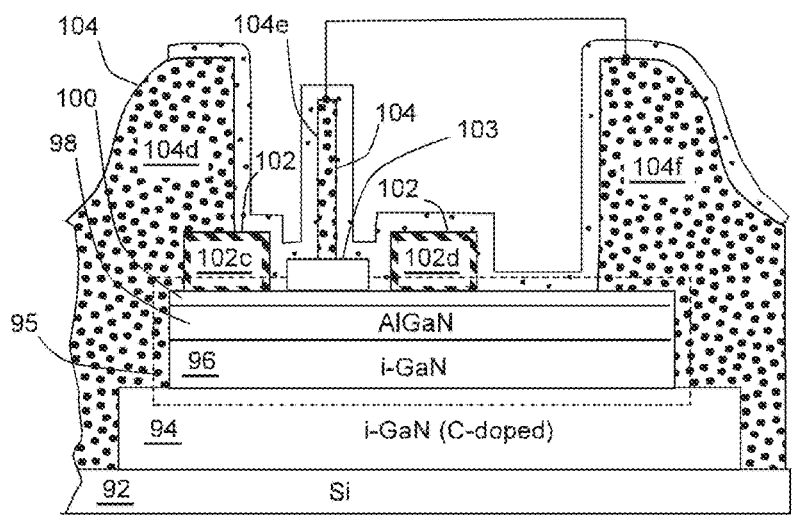
FIG. 13 shows a cross-sectional view of the diode DVF3 taken along the line SD-SD in FIG. 4A, which is disclosed in another embodiment of the present disclosure.

The cross-sectional views in FIGS. 5 and 6 are not limitations to the claims of the present disclosure. For example, FIG. 13 shows the cross-sectional view of the diode DVF3 taken along the line SD-SD in FIG. 4A. For brevity, the same or similar parts between FIG. 13 and FIG. 6 are not described again. The difference between FIG. 6 and FIG. 13 is that in FIG. 13, an insulation layer 103 is formed between the metal strip 104e and the cap layer 100, and the material of the insulation layer 103 can be silicon oxide. The presence of the insulating layer 103 also enhances the breakdown-voltage-withstanding capability of the diode.

Figure 14:
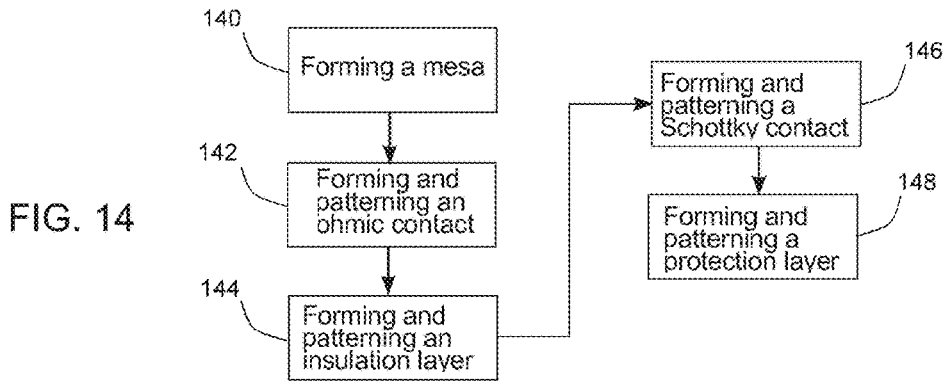
FIG. 14 shows a flow chart for manufacturing a diode disclosed in FIG. 13.

FIG. 14 shows a flow chart for manufacturing a diode in FIG. 13. A mesa is formed in step 140. For example, a channel layer 96, a high band-gap layer 98 and a cap layer 100 are formed respectively on a buffer layer 94 in advance. Then, these three layers are patterned to form the mesa 95 by Inductively Coupled Plasma etching (ICP). An ohmic contact is formed in the step 142. For example, the metal layer 102 is formed by sequentially depositing titanium, aluminum, titanium and gold, and then patterned to from metal strips 102a and 102b. An insulation layer 103 is formed in step 144. For example, a silicon dioxide layer is deposited and then patterned, and the rest of the silicon dioxide layer is used as the insulation layer 103. A Schottky contact forming and patterning process are performed in step 146. For example, nickel, gold and platinum are sequentially deposited to form the metal layer 104 and then patterned to form metal strips 104a, 104b and 104c. The contact between the metal layer 104 and the metal layer 102 is an ohmic contact, but the contact between the metal layer 104 and the mesa 95 is a Schottky contact. In the step 148, a protection layer 105 is formed and pattered to form holes for bonding pads. The manufacturing flow chart shown in FIG. 14 can be adapted to form a HEMT in FIG. 12. With proper adjustments, the flow chart in FIG. 14 can be applied to form the diode and the HEMT in FIG. 4A, such as skipping the step 144 or adding other processes.

Figure 15:
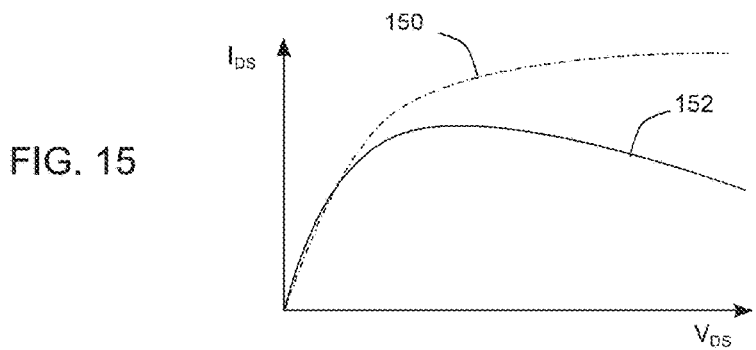
FIG. 15 shows a diagram of $I_{DS}$ and $V_{DS}$ between a MOSFET and a HEMT disclosed in an embodiment of the present disclosure.

The HEMTs T1 and T2 in FIG. 2 and FIG. 5 can be regarded as constant current sources, but those may not be ideal current sources. Drain-to-source currents ($I_{DS}$) of the HEMTs T1 and T2 may be related to the drain-to-source voltage ($V_{DS}$) while the transistors are operated in the saturation region. FIG. 15 shows the diagram of $I_{DS}$ and $V_{DS}$ between a MOSFET and a HEMT. Curves 150 and 152 are respectively related to a silicon-based MOSFET and a HEMT. According to the curve 150, the current $I_{DS}$ and voltage $V_{DS}$ are substantially positively correlated in a MOSFET, that is, the current $I_{DS}$ is increased as the voltage $V_{DS}$ is increased. But, it is different in the HEMT. According to the curve 152, in the HEMT, the relationship between the voltage $V_{DS}$ and current $I_{DS}$ changes from positive correlation to negative correlation while the voltage $V_{DS}$ is higher than a specific value. The specific value can be set by tuning manufacturing parameters. This characteristic of the HEMT is beneficial for operation, for example, while the voltage $V_{DS}$ surges because of the unstable input voltage, the current $I_{DS}$ is decreased to lower the electrically power consumed by the HEMT so as to prevent the HEMT from being burned down.

Figure 16:
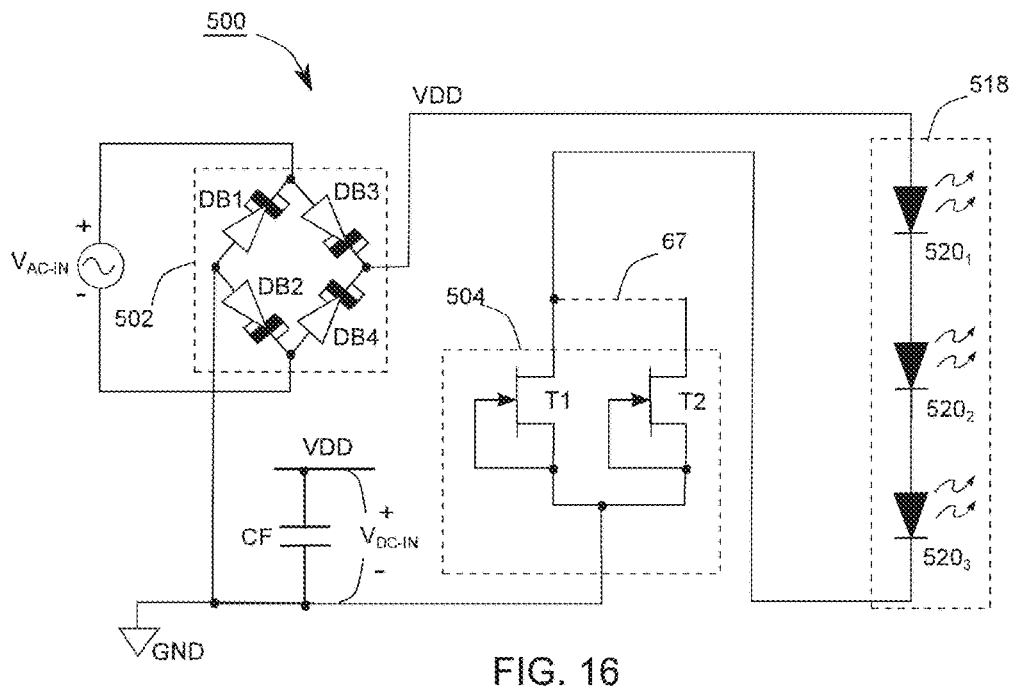
FIG. 16 shows an LED driver in accordance with another embodiment of the present disclosure.
Figure 17:
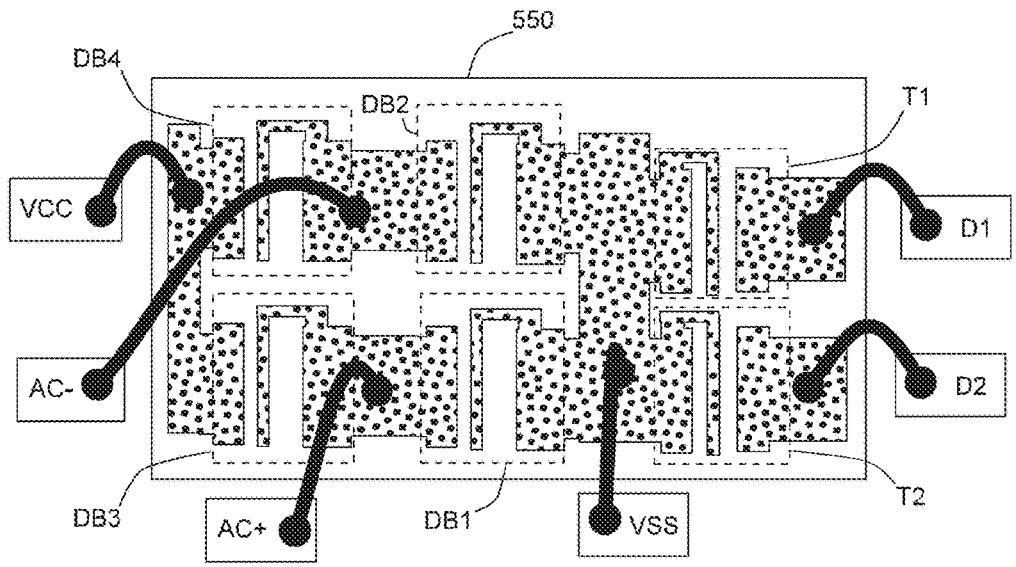
FIG. 17 shows a pattern of a metal layer on a semiconductor chip disclosed in another embodiment of the present disclosure.
Figure 18:
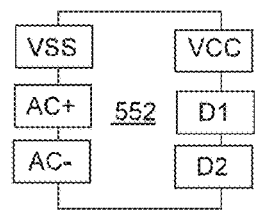
FIG. 18 shows a schematic view of a packaged semiconductor chip disclosed in in FIG. 17.
Figure 19:
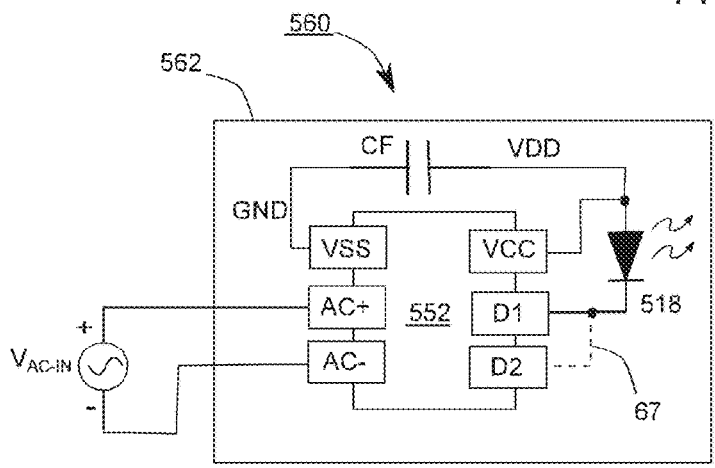
FIG. 19 shows an illumination system including an integrated circuit disclosed in FIG. 18.

In the above embodiments, the LED driver includes a valley-fill circuit, but the present disclosure is not limited thereto. FIG. 16 shows another LED driver 500 to drive LED 518 which includes several LED groups 5201, 5202 and 5203 connected in series. No valley-fill circuit is used in the LED driver 500. The bridge rectifier 502 and the current driver 504 in the LED driver 500 can be integrated in a single semiconductor chip to be packaged as an integrated circuit. FIG. 17 shows a pattern of the metal layer 104 on a semiconductor chip 550 and the relative positions between diodes and HEMTs of FIG. 16. The semiconductor chip 550 integrates the bridge rectifier 502 and the current driver 504 in the LED driver 500. FIG. 18 shows an integrated circuit 552 including a packaged the semiconductor chip 550. FIG. 19 shows an illumination system 560 using the integrated circuit 552 in FIG. 18 to implement the LED driver 500. The embodiments in FIG. 16 to FIG. 19 can be understood through the above description so the details are omitted for brevity. According to FIG. 19, the illumination system 560 includes very small amount of electrical elements, including a capacitor CF, an integrated circuit 552 and an LED 518. The cost of the illumination system 560 is reduced, and the final product is more compact.

Figure 20:
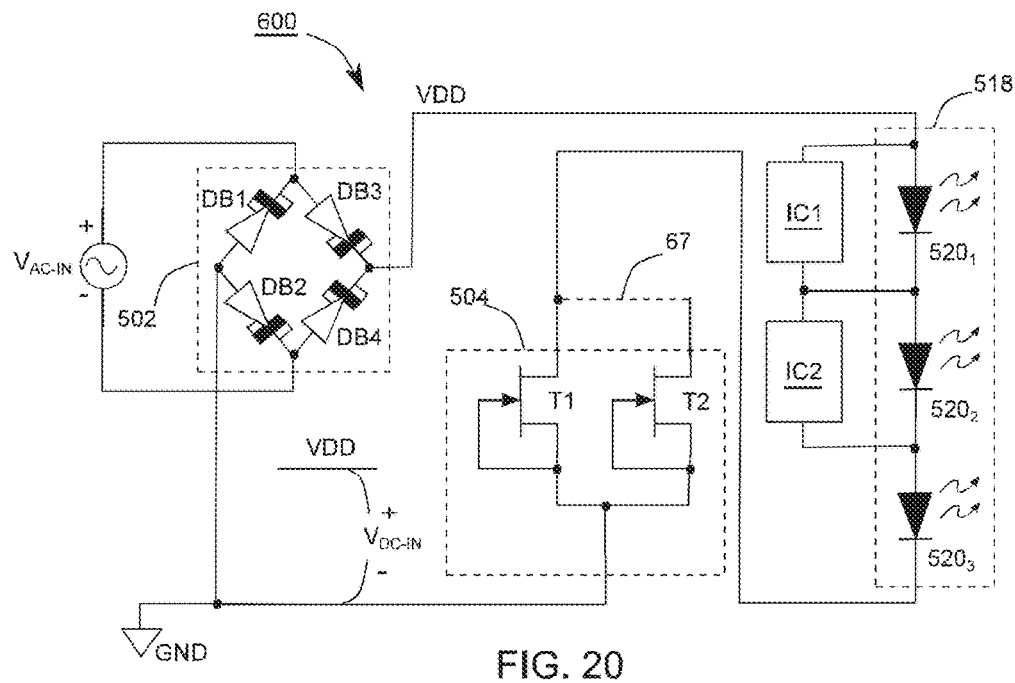
FIG. 20 shows a circuit of an LED driver in accordance with another embodiment of the present disclosure.

The embodiments in FIG. 16 and FIG. 19 are not limitations to restrict application of the integrated circuit 552. FIG. 20 shows an LED driver 600 to explain another application of an integrated circuit including the bridge rectifier 502 and the current driver 504. In FIG. 20, the HEMTs T1 and T2 in the current driver 504 are optionally adopted to drive the LED 518 including LED groups 5201, 5202 and 5203. The LED driver 600 additionally includes dimming circuits IC1 and IC2 which can be short-circuited or open-circuited according to the magnitude of the direct-current voltage $V_{DC\text{-}IN}$. For example, while the magnitude of the direct-current voltage $V_{DC\text{-}IN}$ is higher than that of the forward voltage of the LED group 5203, the dimming circuits IC1 and IC2 are short-circuited so the LED group 5203 emits light and the LED groups 5201 and 5202 do not. When the direct-current voltage $V_{DC\text{-}IN}$ is increased to a magnitude larger than a sum of the magnitudes of the forward voltages of LED groups 5202 and 5203, the dimming circuit IC1 is short-circuited and the dimming circuit IC2 is open-circuited so the LED groups 5202 and 5203 emit light and the LED group 5201 does not. When the direct-current voltage $V_{DC\text{-}IN}$ is increased to a magnitude larger than a sum of the magnitudes of the forward voltages of LED group 5201, 5202 and 5203, the dimming circuit IC1 and the circuit IC2 are open-circuited so the LED groups 5201, 5202 and 5203 emit light. Thus, the electro-optical conversion efficiency of the LED driver 600 can be better and the power factor and the total harmonic distortion can be well controlled.

The integrated circuit disclosed in the present disclosure is not limited to integrating a bridge rectifier and a current driver. The integrated circuits 130 and 522 are embodiments as examples. For example, an integrated circuit in accordance with the present disclosure includes not only the bridge rectifier and the current driver, but also some diodes and HEMTs which can be used in the dimming circuits IC1 and IC2 in FIG. 20.

The integrated circuits disclosed in the present disclosure are not limited to the depletion-mode HEMT. In some embodiments, the integrated circuit includes an enhancement-mode HEMT whose conducting current can be controlled by proper gate voltage so as to change the light intensity emitted by the LED group. For example, the gate voltage of the enhancement-mode HEMTs can be adjusted to change the current entering the LED groups 5201, 5202 and 5203 from the HEMTs so as to change the luminous intensity emitted from the LED groups 5201, 5202, and 5203, while the dimming circuits IC1 and IC2 are adopted to turn the LED groups 5201, 5202, and 5203 on or off.

Figure 21:
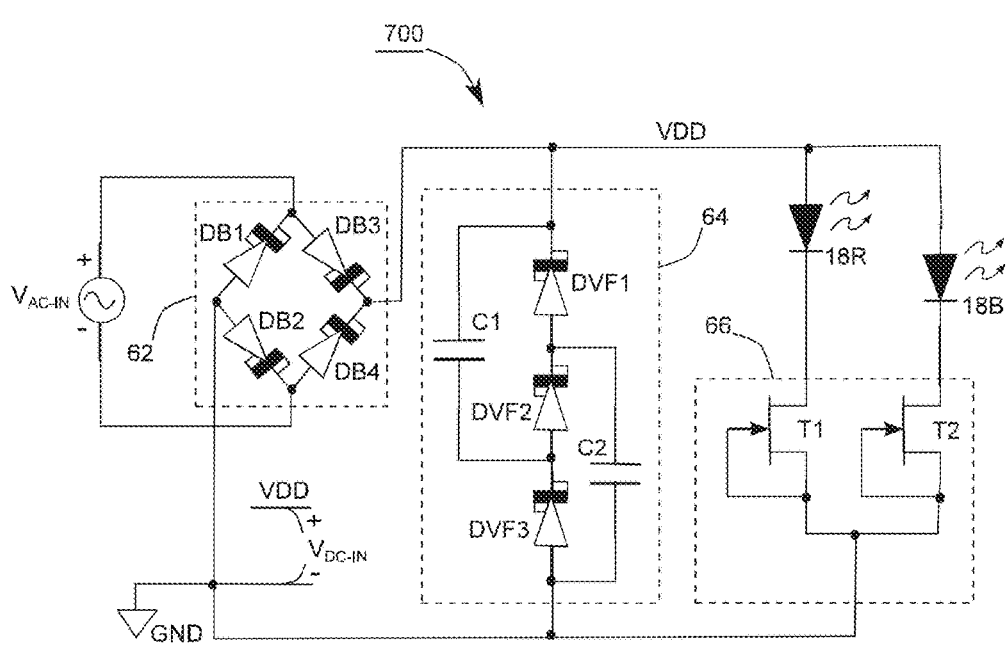
FIG. 21 shows an LED driver including multiple LEDs disclosed in another embodiment of the present disclosure.

Although the LED driver disclosed above is used to drive one LED 518, the presented disclosure is not limited thereto. In some embodiments, two or more LEDs can be respectively driven by different currents. FIG. 21 shows an LED driver 700 whose HEMTs T1 and T2 drive the LEDs 18R and 18B respectively. For example, the current provided by the HEMT T1 is less than that provided by HEMT T2, and the LED 18R is substantially a red light LED and the LED 18B is substantially a blue light LED.

Figure 22:
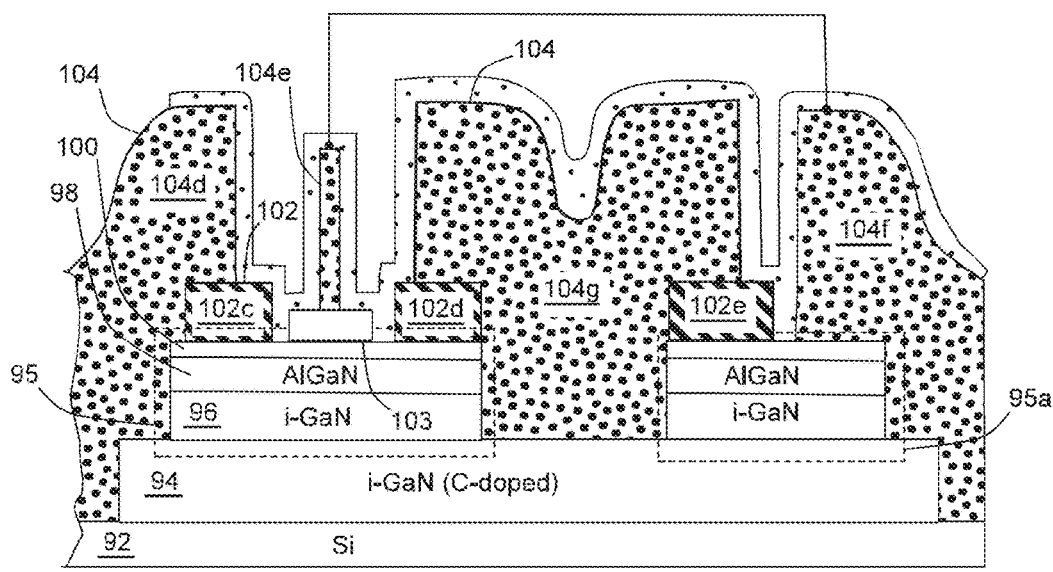
FIG. 22 shows a cross-sectional view of a diode in accordance with another embodiment of the present disclosure.

The diodes in FIG. 6 and FIG. 13 are respectively formed on a single mesa 95, but the present disclosure is not limited thereto. FIG. 22 shows a cross-sectional view of an LED chip in accordance with another embodiment of the present disclosure. The same or similar parts among FIG. 6, FIG. 13, and FIG. 22 are not repeated for brevity. Two mesas 95 and 95a are shown in FIG. 22. The metal strip 102e forms an ohmic contact on the mesa 95a and the metal strip 102d forms another ohmic contact on the mesa 95. The metal strip 102d is electrically connected to the metal strip 102e through the metal strip 104g. The metal strip 104f is used as an anode of a diode and the metal strip 104d is used as a cathode of the diode. The structure in FIG. 22 enhances the breakdown-voltage-withstanding capability of the diode.

Figure 23:
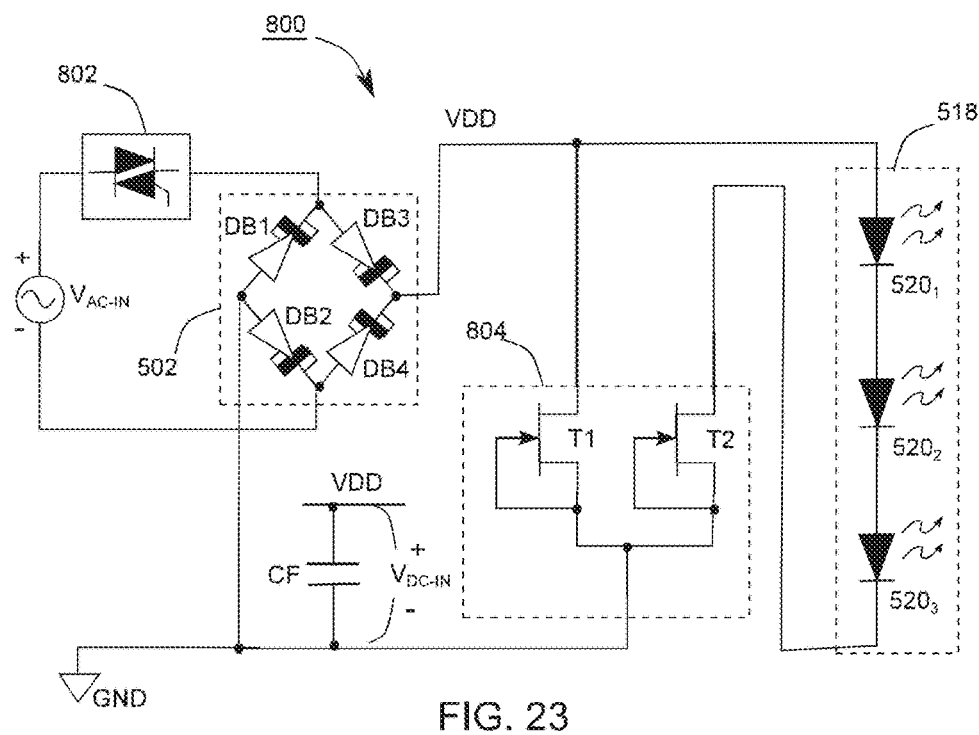
FIG. 23 shows an LED driver in accordance with another embodiment of the present disclosure.

The current drivers 66, 302, and 504 disclosed above are used to drive an LED, but the presented disclosure is not limited thereto. FIG. 23 shows an LED driver 800 in accordance with another embodiment of the present disclosure. The same or similar parts between FIG. 16 and FIG. 23 can be referred to the preceding description and not repeated for brevity. The difference between the LED driver 500 in FIG. 16 and the LED driver 800 in FIG. 23 is that the LED driver 800 includes an TRIAC dimmer 802 and the HEMT T1 in the current driver 804 directly connects the DC power line VDD and the ground line GND and does not drive any LED. When the TRIAC dimmer 802 is turned off as open state, a predetermined amount of holding current is needed to prevent false action for turning off the LED driver 800. In FIG. 23, the HEMT T1 is used to provide the holding current required by the TRIAC dimmer 802. According to the design, the HEMT T2 can provide a relative large current to drive the LED 518 to emit light, and the HEMT T1 is used to provide a relative small current to be a holding current required by the TRIAC dimmer 802 while the LED 518 does not emit light.

The diodes in the aforementioned embodiments are all presented by diode symbol 120 in FIG. 6, which is composed of a HEMT and a Schottky diode, but the present disclosure is no limited thereto. All the diodes in the embodiments can be totally or partially replaced by other types of diodes. For example, FIG. 24 shows a bridge rectifier 806, which is composed of four Schottky diodes SBD1, SBD2, SBD3 and SBD4.

Figure 24:
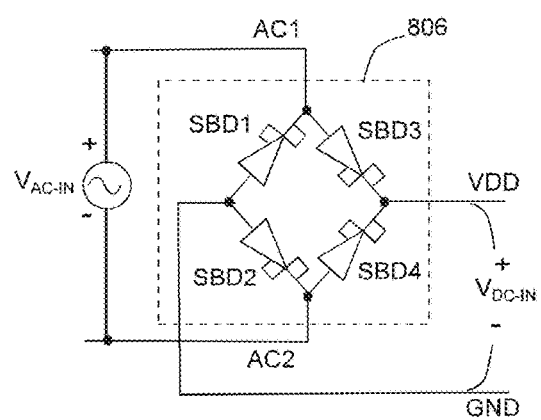
FIG. 24 shows a bridge rectifier.
Figure 25:
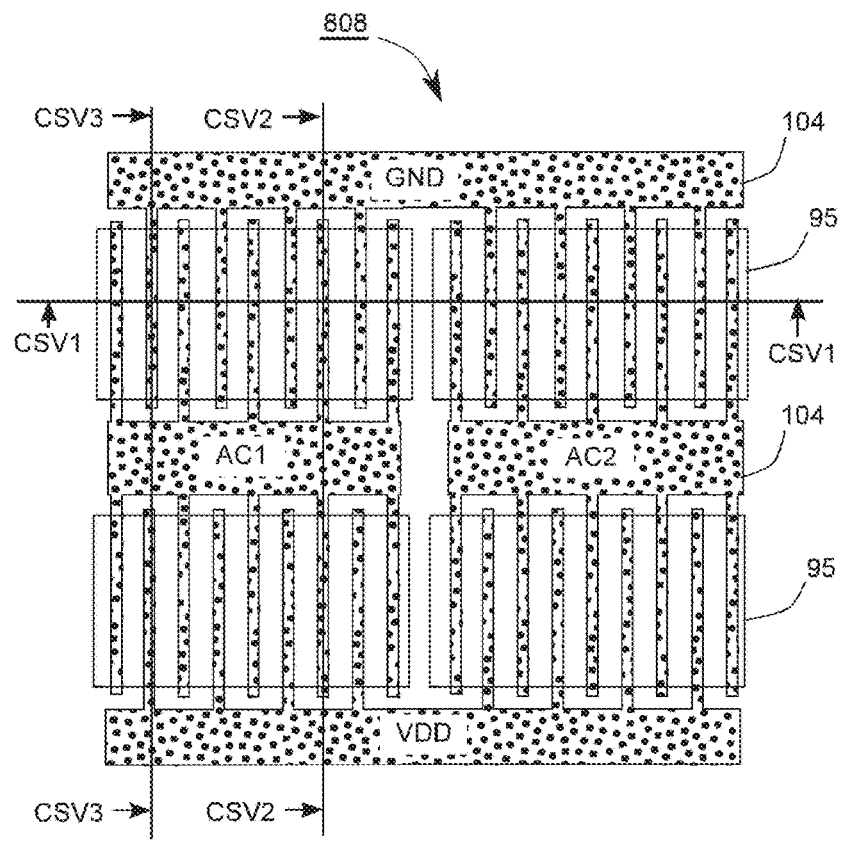
FIG. 25 shows a semiconductor chip which implements a bridge rectifier disclosed in FIG. 24.
Figure 26A:
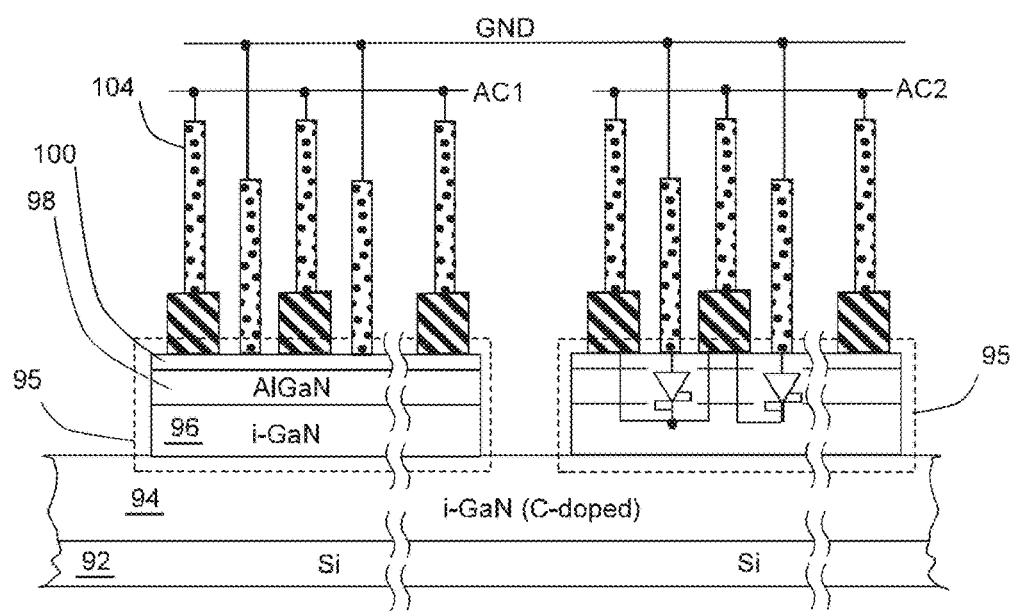
FIGS. 26A-26C show cross-sectional views of a chip 808 take along lines CSV1-CSV1, CSV2-CSV2, and CSV3-CSV3 in FIG. 25.
Figure 26B:
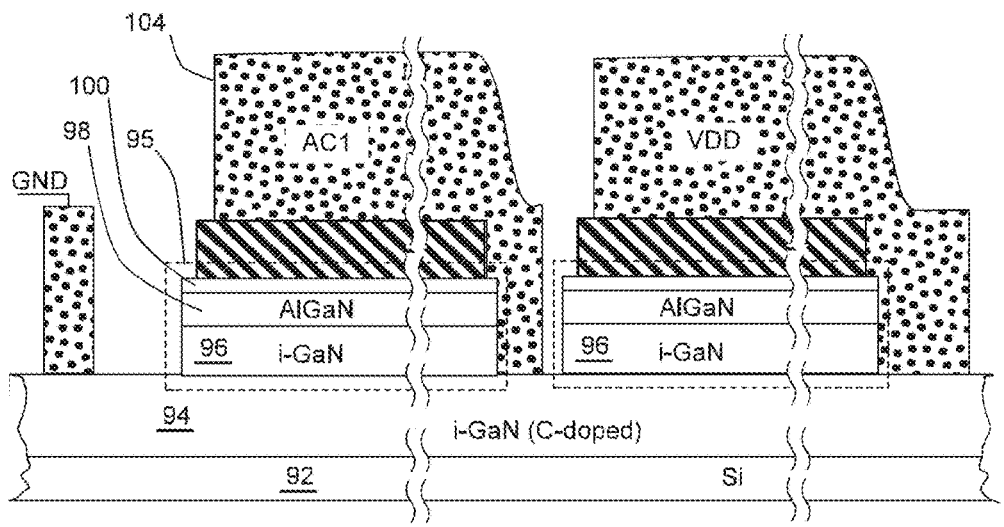
Figure 26C:
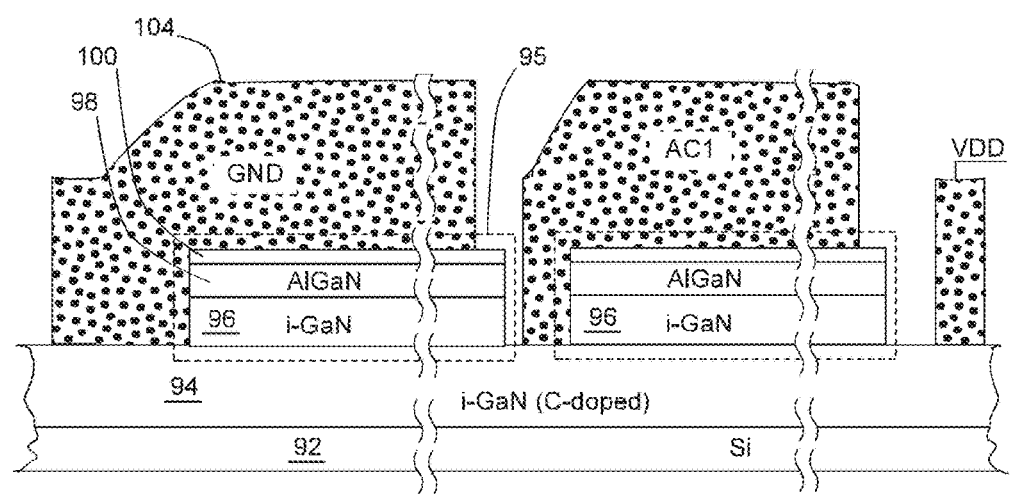

FIG. 25 shows patterns of the metal layer 104 and the mesa 95 on a semiconductor chip 808, which implements the bridge rectifier 806 in FIG. 24. FIGS. 26A, 26B and 26C show cross-sectional views of the semiconductor chip 808 taken along lines CSV1-CSV1, CSV2-CSV2, and CSV3-CSV3. For example, the Schottky diode SBD1 in FIG. 24 connects the AC power line AC1 and the ground line GND. FIG. 25 and FIG. 26A show a HEMT with multi-finger structure. The gate of the HEMT is used as the anode of the Schottky diode SBD1 and the channel of the HEMT is used as the cathode of the Schottky diode SBD1. Equivalently, the Schottky diode SBD1 is made up of many small Schottky diodes connected in parallel. The HEMT with multi-finger structure can provide a larger current in a limited chip area.

Figure 27:
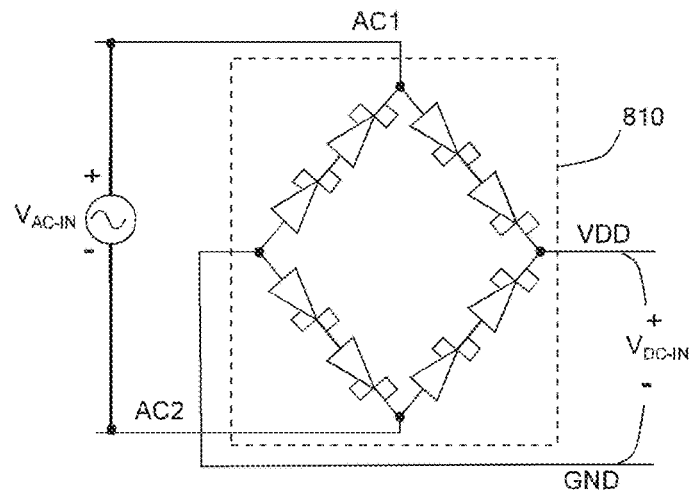
FIG. 27 shows a bridge rectifier in accordance with another embodiment of the present disclosure.
Figure 28:
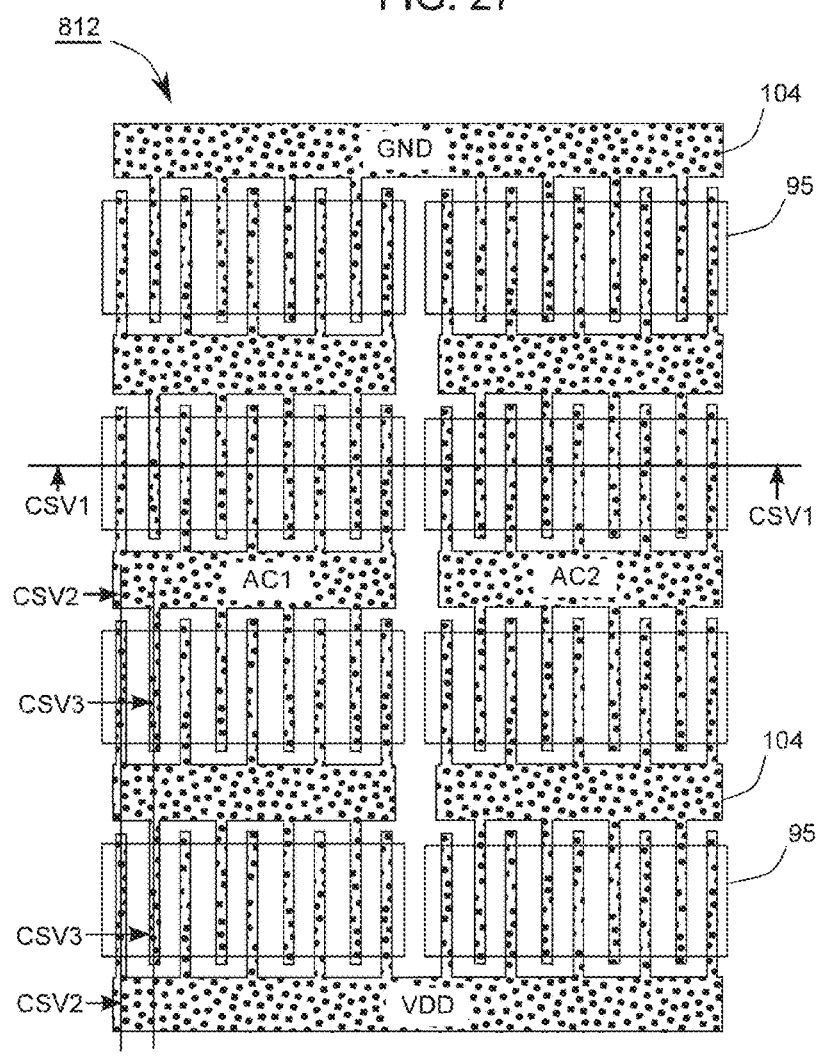
FIG. 28 shows a semiconductor chip which implements a bridge rectifier disclosed in FIG. 27.

In the above embodiments, each of the diodes can be implemented by several diodes connected in series as shown in FIG. 27. FIG. 27 shows another bridge rectifier 810. For example, two Schottky diodes are connected in series between the AC power line AC1 and the ground line GND. FIG. 28 shows patterns of the metal layer 104 and the mesa 95 on a semiconductor chip 812, which can implement the bridge rectifier 810 in FIG. 27. FIGS. 26A, 26B, and 26C can be used to show cross-sectional views of the semiconductor chip 812 taken along lines CSV1-CSV1, CSV2-CSV2, and CSV3-CSV3.

Figure 29A:
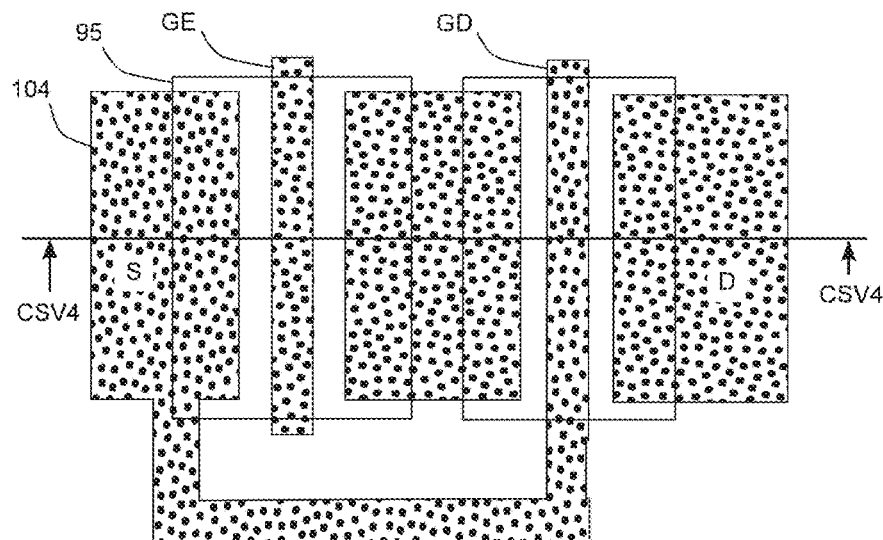
FIG. 29A shows an enhance mode HEMT ME and a depletion mode HEMT MD on a semiconductor chip.
Figure 29B:
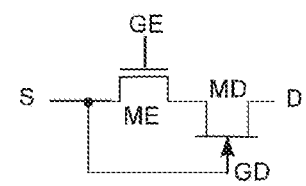
FIG. 29B shows an electrical connection between the HEMTs MD and ME disclosed in FIG. 29A.
Figure 30:
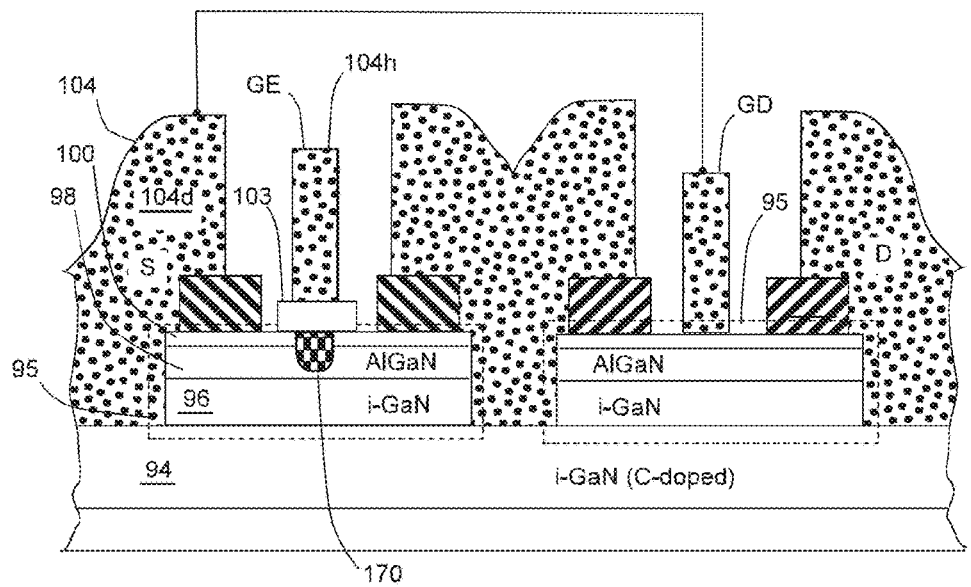
FIG. 30 shows a cross-sectional view of the chip taken along the line CSV4-CSV4 in FIG. 29A.

As previously described, the semiconductor chips disclosed in the disclosure are not limited to the depletion mode HEMT and the Schottky diode, and can also include enhancement mode HEMT (E-mode HEMT). FIG. 29A shows patterns of the metal layer 104 and the mesa 95 of an enhancement mode HEMT ME and a depletion mode HEMT MD on a semiconductor chip. FIG. 29B shows an electrical connection between the HEMTs MD and ME in FIG. 29A. FIG. 30 shows a cross-sectional view of the chip taken along the line CSV4-CSV4 in FIG. 29A. As shown in FIG. 30, the left part is the enhancement mode HEMT ME, wherein an insulation layer 103 is formed between the metal strip 104h, used as a gate GE, and the cap layer 100. The parts of the cap layer 100 and the high band-gap layer 98 under the metal strip 104h form a modification area 170. For example, the modification area 170 can be formed by partially implanting the fluorine ions into the cap layer 100 the high band-gap layer 98. Compared with the depletion mode HEMT MD in the left part of FIG. 22, the enhancement mode HEMT ME in the left part of FIG. 30 includes the modification area 170 and the insulation layer 103. Both of the modification area 170 and the insulation layer 103 are used to adjust or increase the threshold voltage $V_t$ of the HEMT.

As shown in FIGS. 29A, 29B, and 30, the gate GD of the depletion mode HEMT MD is electrically connected to the node S of the enhancement mode HEMT ME through the metal layer 104.

Referring to the circuit shown in FIG. 29B, the voltage applied from the node D to the node S is shared by the HEMT ME and the HEMT MD while the HEMT ME is turned off (as an open state) so the circuit in FIG. 29B can include a good voltage-endurance capability. When the HEMT ME is turned on (as a conductive state), the HEMT MD is used as a constant current source to limit the maximum current value between the node D and the node S.

Figure 31:
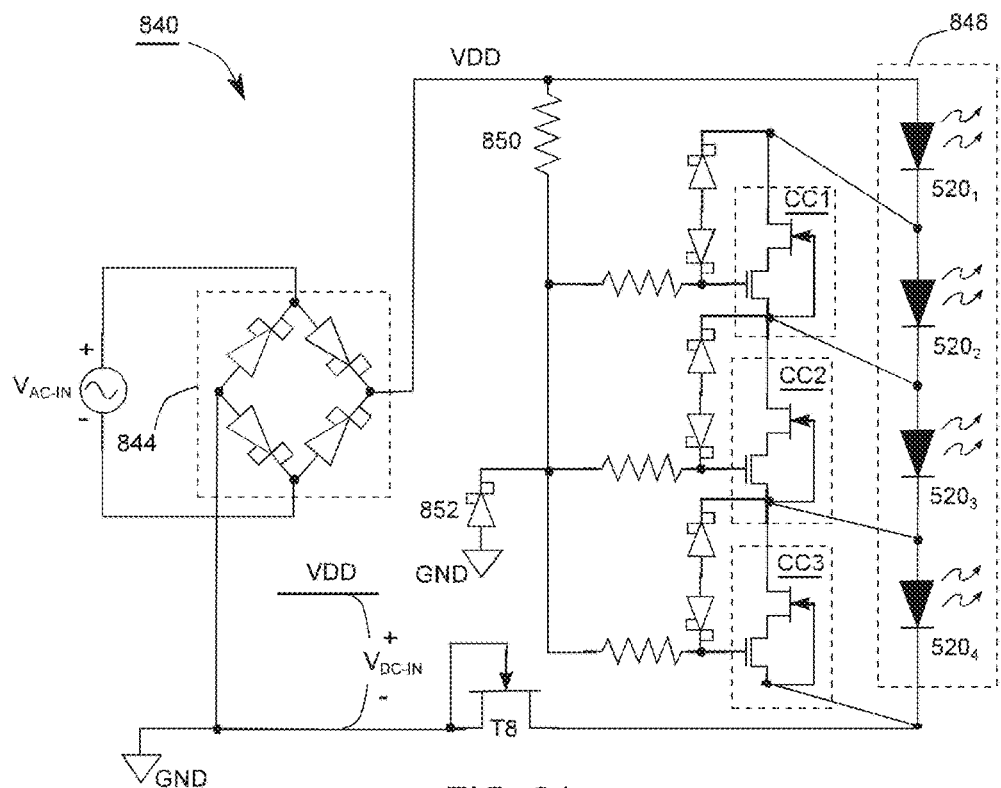
FIG. 31 shows an LED driver in accordance with another embodiment of the present disclosure.

The enhancement mode HEMT in FIGS. 29A and 29B can be used as a switch in a semiconductor chip. FIG. 31 shows an electrical design of an LED driver 840 in accordance with an embodiment of the present disclosure, which includes an enhancement mode HEMT and a depletion mode HEMT. Besides some Schottky diodes and resistors, the LED driver 840 includes current switches CC1, CC2, and CC3 and a depletion mode HEMT T8, wherein the electrical connections among these elements are shown in FIG. 31. The current switches CC1, CC2, and CC3 can be implemented by the device structures shown in FIG. 29A and FIG. 30. In an embodiment, the maximum current allowed passing through the current switches CC1, CC2, CC3 and the depletion mode HEMT T8 are current I1, I2, I3 and I4 respectively, wherein the I1<I2<I3<I4. Each of the current switches CC1, CC2, and CC3 includes a control end, i.e. the gate of an enhancement mode HEMT, which is connected to a Schottky diode 852 through a corresponding resistor. One end of the Schottky diode 852 is connected to the resistors and the other end of the Schottky diode 852 is connected to the ground line GND.

Figure 32:
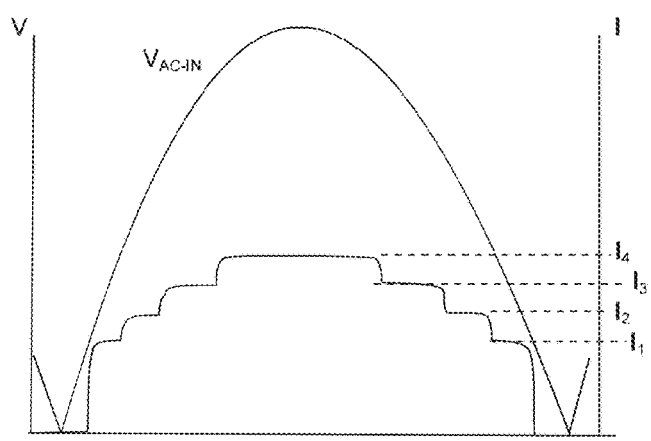
FIG. 32 shows a waveform of the AC input power source and a waveform of a current passing through the bridge rectifier 844 disclosed in FIG. 31.

FIG. 32 shows a waveform of voltage provided by the AC input power source $V_{AC\text{-}IN}$ and a waveform of a current passing through the bridge rectifier 844 in FIG. 31. As the voltage between the DC power line VDD and the ground line GND gradually increases from 0V, the switches CC1, CC2, and CC3 are all turned on. Meanwhile, the LED group 5201 emits light, and the LED groups 5202, 5203, and 5204 do not emit light. The driving current passing through LED group 5201 is limited by the current switch CC1, and the maximum magnitude of the current is I1. With the increase of voltage between the DC power line VDD and the ground line GND, the current switch CC1 is turned off and the LED group 5202 joins to emit a light. Meanwhile, the driving current passing through the LED groups 5201 and 5202 is limited by the current switch CC2, and the maximum magnitude of the current is I2. With further increase of voltage between the DC power line VDD and the ground line GND, the current switch CC2 is turned off and the LED group 5203 joins to emit a light. Meanwhile, the driving current passing through the LED groups 5201, 5202, and 5203 is limited by the current switch CC3, and the maximum magnitude of the current is I3. When the voltage between the DC power line VDD and the ground line GND exceeds a specific level, the current switches CC1, CC2, and CC3 are all turned off, and the LED groups 5201, 5202, 5203, and 5204 all emit a light. In this state, the driving current passing through the LED groups 5201, 5202, 5203 and 5204 is limited by the depletion mode HEMT T8, and the maximum magnitude of the current is I4. When the voltage between the DC power line VDD and the ground line GND decreases from the maximum magnitude, the current switches CC3, CC2 and CC1 are turned on sequentially. Referring to FIG. 32, the LED driver 840 in FIG. 31 includes not only good power factor but also low total harmonic distortion (THD).

In FIG. 31, the current switches CC3, CC2, and CC1 are respectively connected to two Schottky diodes reversely connected in series. Each pair of the Schottky diodes are connected to a control end and a high voltage end of each of the current switches. In another embodiment, these Schottky diodes, such as the six Schottky diodes in FIG. 31A, are omitted in consideration of cost.

The Schottky diode 852 connecting the resistor 850 and the ground line GND can be used to limit the maximum magnitude of the voltage applied on the control ends of current switches CC3, CC2, and CC1. When a surge voltage happens on the DC power line VDD, the Schottky diode 852 is used to prevent the enhancement mode HEMT from burning caused by over-high gate voltage.

All the Schottky diodes and HEMTs in the LED driver 840 in FIG. 31 can be integrated in a single crystal microwave integrated circuit including GaN-based channel. For example, the Schottky diodes can be implemented by the device structure shown in FIG. 6 or FIG. 26A, and the enhancement mode HEMT and the depletion mode HEMT can be implemented by the device structures shown in the left part and the right part in FIG. 30 respectively. In other words, the LED driver 840 may be implemented by a single crystal micro-wave integrated circuit, some resistors, an LED 848 and a printed circuit board (PCB). As a result, the cost is lower.

As the ambient temperature increases, the luminance from an LED driven by a constant current may be decreased. In some embodiments of the present disclosure, in order to compensate the decrease of the luminance resulted from the high temperature, a thermistor with negative thermal coefficient or positive thermal coefficient can be used to adjust the LED driving current.

Figure 33:
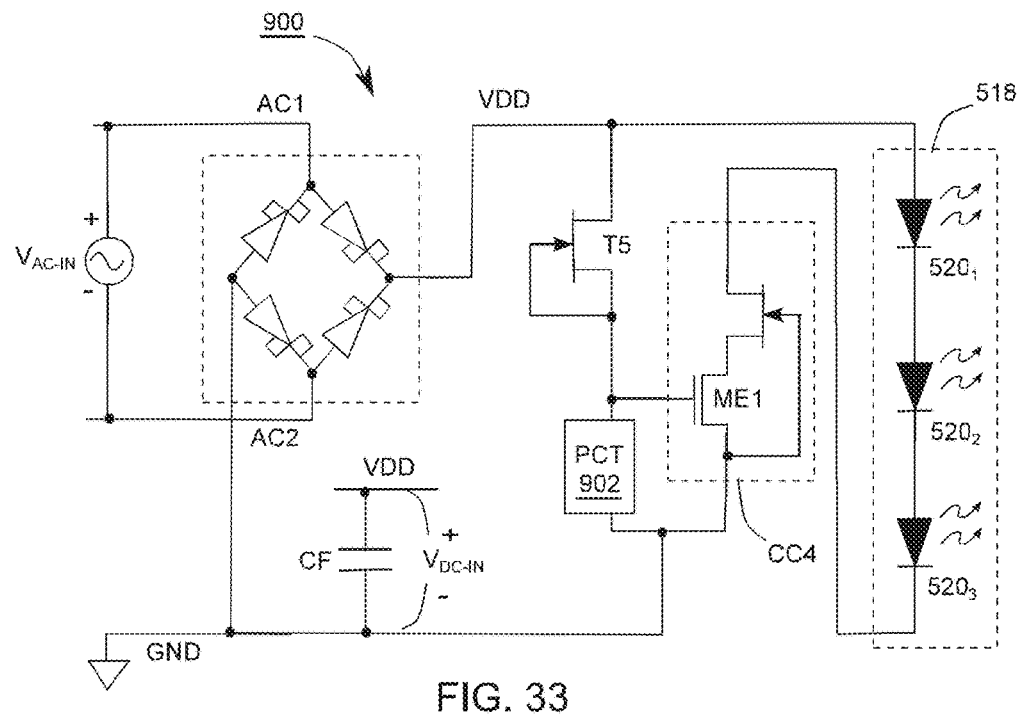
FIG. 33 shows an LED driver including a thermistor with positive temperature coefficient.

FIG. 33 shows an LED driver 900 including a thermistor 902 with positive temperature coefficient, wherein the two nodes of the thermistor 902 are connected respectively to a gate and a channel of a HEMT ME1 in a current switch CC4. The depletion mode HEMT T5 is used as a constant current source to provide a substantially constant current passing through the thermistor 902, and the enhancement mode HEMT ME1 is operated in the linear region. When the ambient temperature is increased, the resistance of the thermistor 902 is increased, so the voltage applied to the gate end is increased to increase current passing through the LED 518. Thus, the luminous quantity emitted from the LED 518 is substantially unchanged with the variation of temperature.

Figure 34:
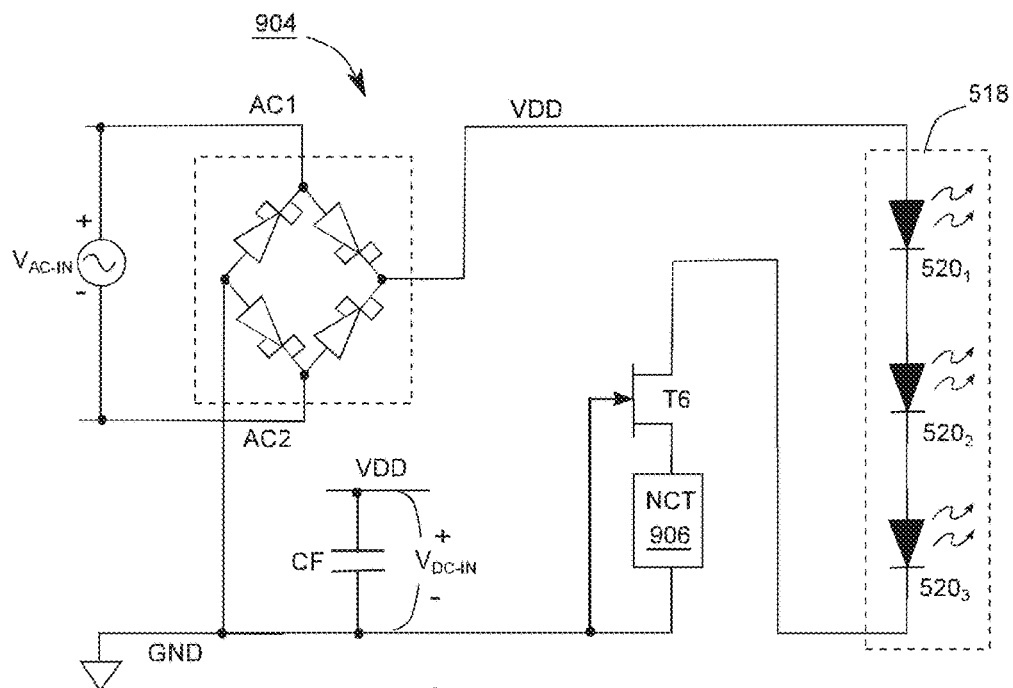
FIG. 34 shows an LED driver including a thermistor with negative temperature coefficient.

FIG. 34 shows an LED driver 904 including a thermistor 906 with negative temperature coefficient. The depletion mode HEMT T6 can be used as a constant current source, and the constant current is substantially controlled by the source voltage thereof. When the ambient temperature increases, the resistance of the thermistor 906 decreases so the source voltage of the depletion mode HEMT T6 is decreased and the gate-to-source voltage thereof is increased to increase the current passing through the LED 518. Thus, the luminous quantity emitted from the LED 518 is substantially unchanged with the variation of temperature.

Figure 35:
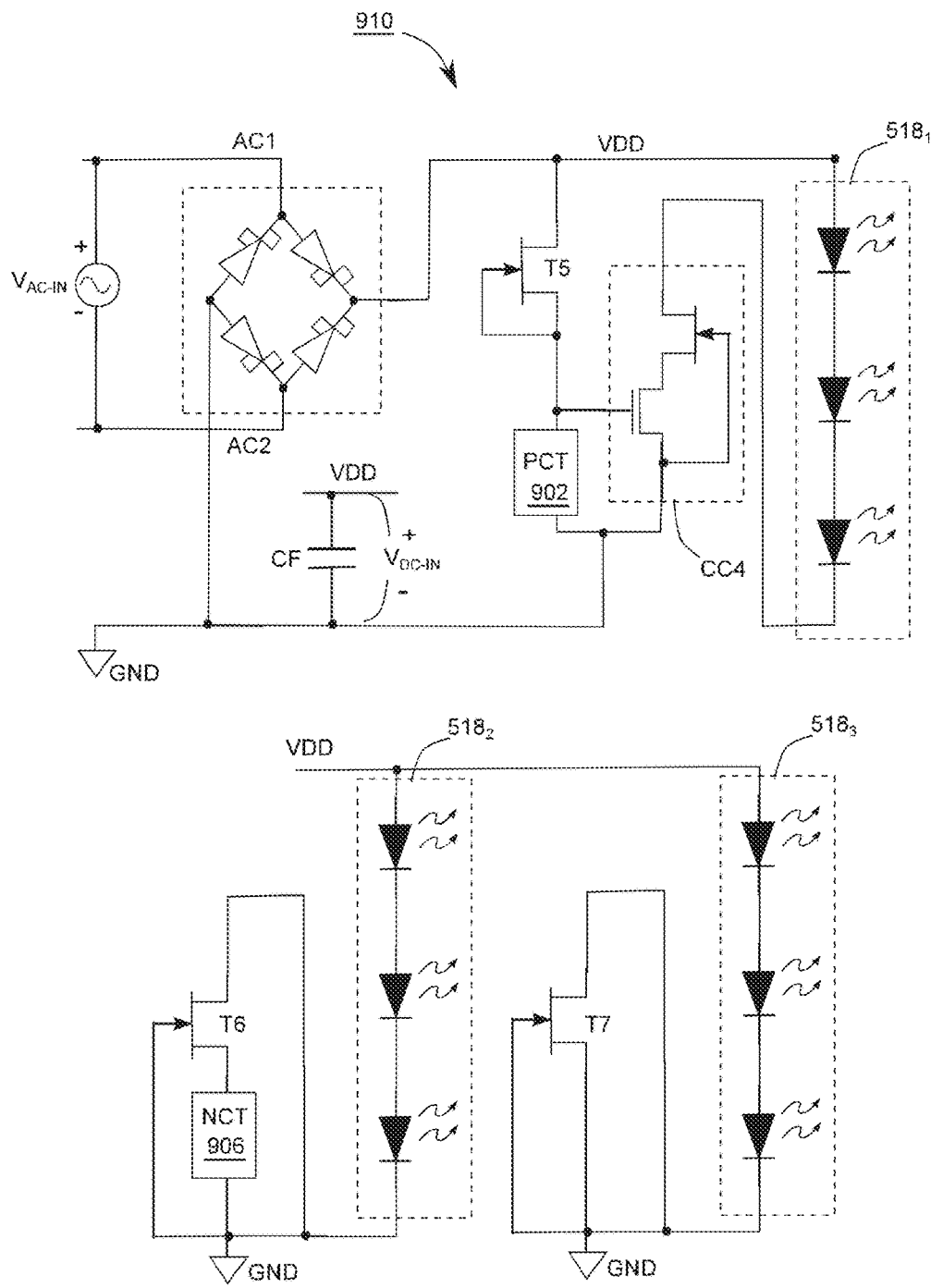
FIG. 35 shows another LED driver including a thermistor.

The LED driver disclosed in the present disclosure is not limited to one LED or one thermistor. FIG. 35 shows an LED driver 910 including LEDs 5181, 5182 and 5183. Similar to the disclosure in FIG. 33, the driving current passing through the LED 5181 is controlled by the thermistor 902 and increased with the increase of temperature. Similar to the disclosure in FIG. 34, the driving current passing through the LED 5182 is controlled by the thermistor 906 and increased with the increase of temperature. The driving current passing through the LED 5183 is controlled by a depletion mode HEMT T7 and substantially unchanged with variance with temperature. In an embodiment, the LED 5183 is a blue light LED and the LED 5181 or 5182 is a red light LED.

Figure 36A:
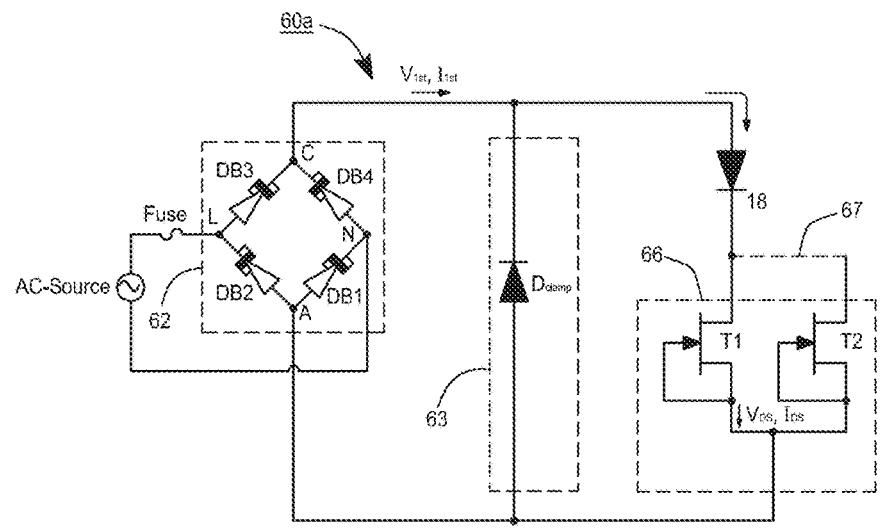
FIG. 36A shows an LED driver in accordance with an embodiment of the present disclosure.
Figure 36B:
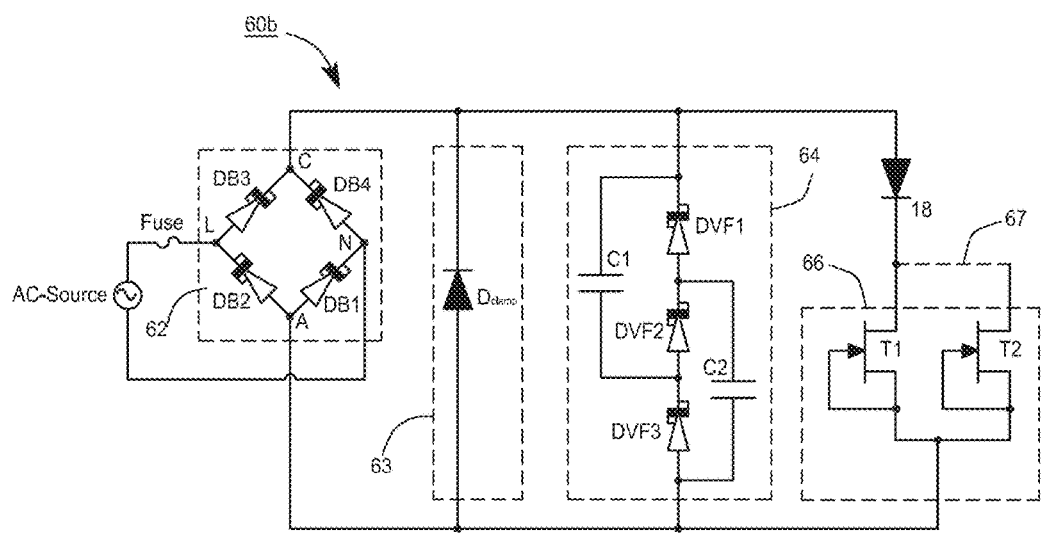
FIG. 36B shows an LED driver in accordance with another embodiment of the present disclosure.

FIG. 36A shows an LED driver 60a in accordance with an embodiment of the present disclosure, which can be used to drive an LED. The LED can be the LED 18 consisting of multiple micro LEDs connected in series and the equivalent forward voltage $V_{ef\text{-}led}$ of the LED 18 can be between 50V and 140V according to the actual needs. Similar to the LED driver 60 disclosed in FIG. 2, the LED driver 60a in the embodiment includes three parts, that is, a bridge rectifier 62 electrically connected between the LED 18 and the AC input power source (AC-source), a protection circuit 63 electrically connected between the bridge rectifier 62 and the LED 18 and a current driver 66 electrically connected between LED 18 and the bridge rectifier 62, wherein the current driver 66 includes two HEMTs T1 and T2. The bridge rectifier 62 can be used as a rectifying circuit for converting an AC input power source (AC-source) into a DC power source (DC-source). The DC-source provides a direct current $I_{DC\text{-}IN}$ and a direct-current voltage $V_{DC\text{-}IN}$ to the LED 18. The HEMTs T1 and T2 are used to limit the magnitude of the direct current $I_{DC\text{-}IN}$ so as to substantially provide a constant current to drive LED 18. The protection circuit 63 includes a protection unit $D_{clamp}$ connecting the current driver 66 and the LED 18 and connected to the bridge rectifier 62 in parallel. When the direct-current voltage $V_{DC\text{-}IN}$ is greater than a predetermined magnitude, the direct current $I_{DC\text{-}IN}$ flows to the protection circuit 63. The difference between the present embodiment and the aforementioned embodiment is that the present embodiment focuses on the protection of the components; therefore the protection circuit 63 is used to replace the valley-fill circuit 64 in the aforementioned embodiment. However, the present disclosure is not limited thereto. In other embodiment, the LED driver can include both the protection circuit and the valley-fill circuit. Referring to FIG. 36B, it shows an LED driver 60b in accordance with another embodiment of the present disclosure. The LED driver 60b includes four parts, that is, a bridge rectifier 62 electrically connected between the LED 18 and the AC-input power source (AC-source), a protection circuit 63 electrically connected between the bridge rectifier 62 and the LED 18, a current driver 66 electrically connected between LED 18 and the bridge rectifier 62, and a valley-fill circuit 64. In short, compared with the LED driver 60a, the LED driver 60b further includes the valley-fill circuit 64 connected in parallel with the protection circuit 63 and the current driver 66 respectively.

In the LED driver 60a of FIG. 36A, the bridge rectifier 62 is connected with the AC input power source (AC-source) through the nodes N and L, and connected in series with the LED 18 through the nodes C and A. The bridge rectifier 62 includes four rectifying diodes DB1-DB4, which rectify the AC input power source (AC-source) to a DC power source, wherein the voltage waveforms of the AC input power source (AC-source) and the DC power source (DC-source) are respectively referred to the voltage waveforms 72, 74 in FIG. 3. The DC power source can provide a direct current $I_{DC-IN}$ and a direct-current voltage $V_{DC-IN}$ to the LED 18. For example, the AC input power source (AC-source) can be a 110V or 220V provided by alternating-current mains.

Figure 37:
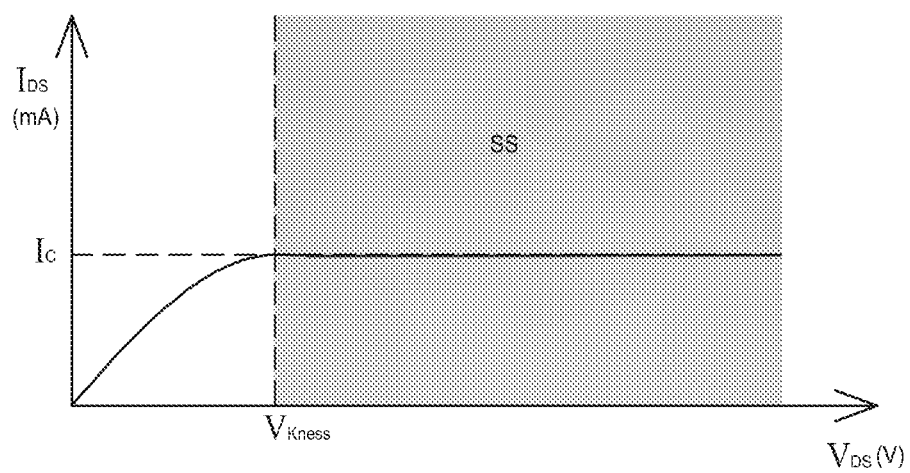
FIG. 37 shows a diagram of voltage and current of a HEMT.

Referring to FIG. 36A, the current driver 66 is connected in series with the LED 18, and limits the magnitude of the direct current $I_{DC-IN}$ to provide substantially a constant current to the LED 18. The HEMTs T1, T2 in the current driver 66, as described above, can be depletion mode transistors, meaning that their threshold voltages ($V_{TH}$) are negative. Each HEMT includes a gate, a source, and a drain. In the embodiment, the gate of each of the HEMTs H1 and H2 is connected with the source thereof. In addition, as described above, the HEMTs T1 and T2 can also be used independently as a constant current source, or the HEMTs T1 and T2 can be connected in parallel as a current source which provides a larger current magnitude. In FIG. 36A, the HEMT T2 and the LED 18 are also connected with a dashed line 67, similarly to FIG. 2, which means the HEMT T2 can be optionally connected to the HEMT T1 to drive the LED 18 together. To further understand the characteristics of the HEMT, taking the HEMT T1 as an example and referring to FIG. 37 which shows the voltage and current relation chart of the HEMT T1. As shown in FIG. 37, when the drain-to-source voltage $V_{DS}$ of the HEMT T1 is greater than the knee voltage $V_{knee}$ of the HEMT T1, the HEMT T1 is operated in the saturation region SS. The drain-source current $I_{DS}$ of the HEMT T1 is substantially a constant $I_C$, referred to as the saturation current. The magnitude of the drain-to-source voltage $V_{DS}$ of the HEMT T1 is that the magnitude of the direct current voltage $V_{DC-IN}$ minus the magnitude of the equivalent forward voltage $V_{ef-led}$ (50V in the embodiment) of the LED 18, and then minus the magnitude of the voltage (about 1.5V) of a single rectifier diode $V_{DBi}$, wherein i=1, 2, 3, 4. That is $V_{DS}=V_{DC-IN}-V_{ef-led}-V_{DBi}$.

The protection circuit 63 connects the current driver 66 and LED 18 and is connected to the rectifier circuit (the bridge rectifier 62) in the reverse direction. The protection circuit 63 includes the protection unit $D_{clamp}$, which is mainly used to protect the current driver 66, i.e. the HEMTs T1 and T2. Taking the HEMT T1 as an example, in order to achieve the above purpose for effectively protecting the HEMT T1, the protection unit $D_{clamp}$ selected in the embodiment includes a reverse conduction voltage $V_{clamp}$ less than the breakdown voltage $V_{break}$ of the HEMT T1. For example, when the breakdown voltage $V_{break}$ of the HEMT T1 is 600V, the protection unit $D_{clamp}$, whose reverse conduction voltage $V_{clamp}$ is 560V, can be selected. In the embodiment, the protection unit $D_{clamp}$ is a clamping diode, and the clamping diode as the protection unit $D_{clamp}$ is characterized by its reverse conduction voltage $V_{clamp}$, which is tens of volts to hundreds of volts, much higher than the conduction voltage, which is about several volts, and the resistance of the protection unit $D_{clamp}$ is very small when being turned on in the reverse direction. When a surge voltage occurs to render the DC voltage $V_{DC-IN}$ exceed the reverse conduction voltage $V_{clamp}$ of the protection unit $D_{clamp}$ ($V_{DC-IN}>V_{clamp}$), the protection unit $D_{clamp}$ is turned on. At this time, because the reverse conduction resistance is very small, most of the direct current $I_{DC-IN}$ flows to the protection unit $D_{clamp}$. In addition, the reverse conduction voltage $V_{clamp}$ of the protection unit $D_{clamp}$ selected in the embodiment is smaller than the breakdown voltage $V_{break}$ of the HEMT T1. Thus, the HEMTs T1 and T2 can be effectively protected from burning caused by the drain-to-source voltage $V_{DS}$ exceeding the breakdown voltage $V_{break}$ due to the excessively high DC voltage $V_{DC-IN}$. In addition, the reverse conduction voltage $V_{clamp}$ of the protection unit $D_{clamp}$ of the present embodiment is higher than the equivalent forward voltage $V_{ef-led}$ of the LED 18. Generally, in the absence of the surge voltage, the direct-current voltage $V_{DC-IN}$ is smaller than the reverse conduction voltage $V_{clamp}$ of the protection unit $D_{clamp}$, at this time, the protection unit $D_{clamp}$ is non-conductive so the DC current $I_{DC-IN}$ flows to the LED 18. The protection unit $D_{clamp}$ does not affect the operation of the LED 18.

In order to briefly explain the operation of the LED driver 60a, the following description is only for the LED 18 driven by the HEMT T1. That is, the dashed line 67 does not connect the HEMT T2 and LED 18, and the HEMT T1 is not connected in parallel with the HEMT T2. As described above, in the case where the direct current voltage $V_{DC-IN}$ is less than the reverse conduction voltage $V_{clamp}$ of the protection unit $D_{clamp}$, the protection unit $D_{clamp}$ is non-conductive. After the bridge rectifier 62 rectifies the AC input power source (AC-source) to the DC power source (DC-source), the DC power source provides the DC current $I_{DC-IN}$ and the DC voltage $V_{DC-IN}$ to the LED 18. Because of the electrical connection between the LED 18 and the HEMT T1, the magnitude of the direct current $I_{DC-IN}$ flowing to the LED 18 will be limited by the HEMT T1. The discussion below is based on the situation where the LED 18 is turned on (the DC voltage $V_{DC-IN}$ is greater than the equivalent forward voltage $V_{ef-led}$), and the drain-to-source voltage $V_{DS}$ of the HEMT T1 is greater than the knee voltage $V_{knee}$ of the HEMT T1. In the above situation, since the HEMT T1 is operated in the saturation region SS (as shown in FIG. 37), the drain-to-source current $I_{DS}$ is approximately a constant $I_C$ (referred to as the saturation current). According to Kirchhoff's current law, the magnitude of the drain-to-source current $I_{DS}$ is equal to that of the direct current $I_{DC-IN}$ flowing through the LED 18 ($I_C=I_{DC-IN}$) so the HEMT T1 can be functioned as a constant current source to limit the magnitude of the DC current $I_{DC-IN}$ so as to provide a constant current to drive the LED 18 and maintain a certain the luminous intensity of the LED 18. In the embodiment, the voltage $V_{DBi}$ of a single rectifier diode is about 1.5V, the equivalent forward voltage $V_{ef-led}$ of the LED 18 is about 50V, and the breakdown voltage $V_{break}$ and the knee voltage $V_{knee}$ of the HEMT T1 is about 600V and 5V respectively, whose saturation current $I_C$ is about 110 mA. The above numerical description of the HEMT T1 still complies with the curve characteristics of FIG. 37. The above numerical values are only an embodiment and are not intended to limit the present invention. When the DC voltage $V_{DC-IN}$ is between 60V and 110V, the magnitude of drain-to-source voltage $V_{DS}$ is about 8V-55V ($V_{DS}=V_{1st}-V_{ef-led}-V_{DBi}$), which is greater than the knee voltage $V_{knee}$. At this time, the drain-to-source voltage $V_{DS}$ of the HEMT T1 is in the saturation region SS (between 5V and 700V) so the magnitude of the DC current $I_{DC-IN}$ can be limited, thereby providing the LED 18 with a constant current $I_C$, i.e. 110 mA. On the other hand, when a surge voltage occurs, if the DC voltage $V_{Dc-IN}$ corresponding to the surge voltage is greater than the reverse conduction voltage $V_{clamp}$ of the protection unit $D_{clamp}$, the protection unit $D_{clamp}$ is turned on and most of the current flow to the protection unit $D_{clamp}$ to protect the HEMT T1 and prevent the HEMT T1 from burning.

Figure 38:
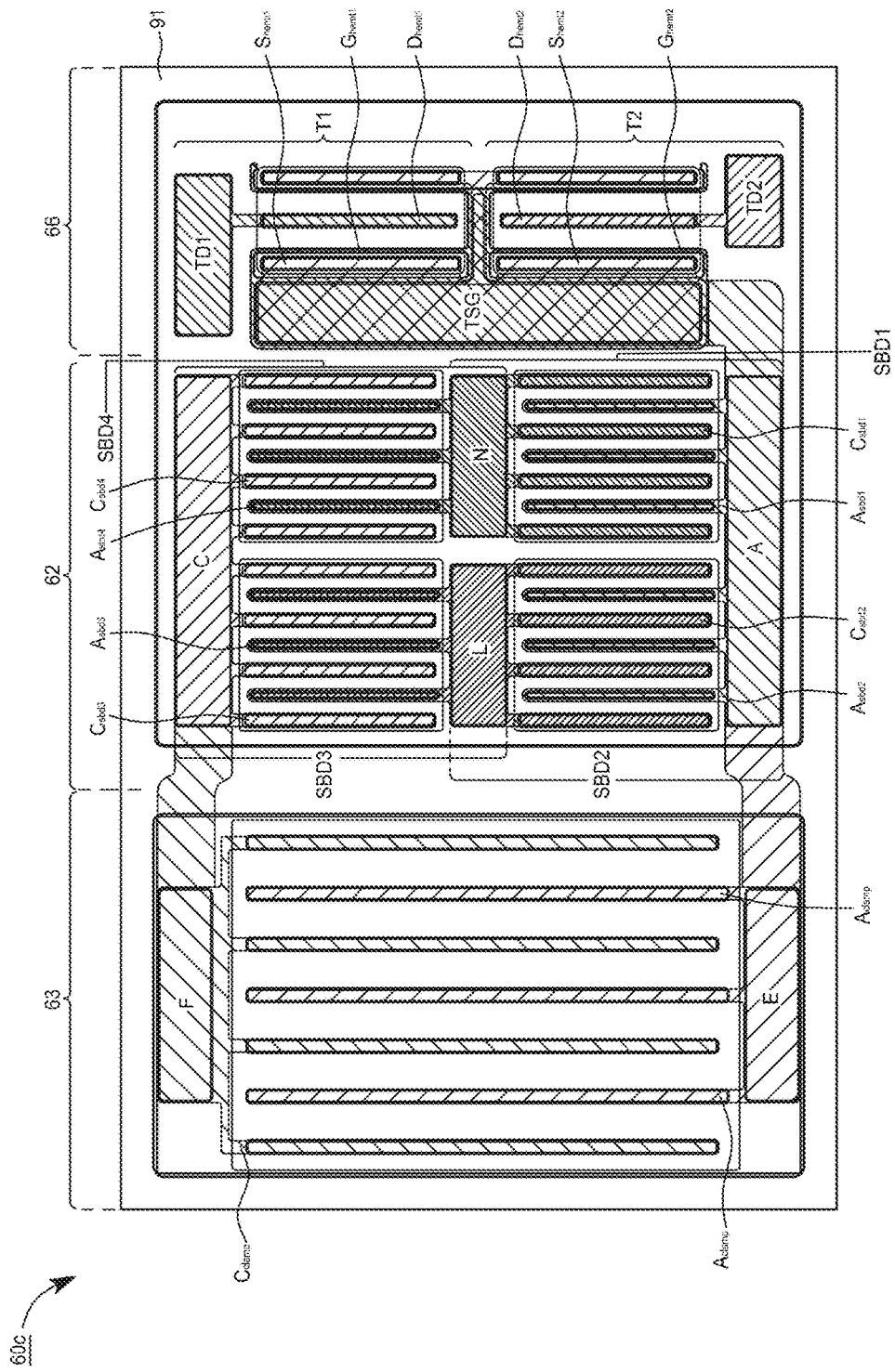
FIG. 38 shows a top view of the LED driver in accordance with another embodiment of the present disclosure.

In order to simplify the manufacturing process of the LED driver 60a, in an embodiment of the present disclosure, the rectifying diodes DB1-DB4, the HEMTs T1 and T2, and the protection unit $D_{clamp}$ in FIG. 36A can be formed on a substrate 91 together. FIG. 38 shows a top view of the LED driver 60c. In FIG. 38, the LED driver 60c includes a bridge rectifier 62, a protection circuit 63, and a current driver 66. In the embodiment, the current driver 66 includes two HEMTs T1 and T2, and the protection circuit 63 includes a protection unit $D_{clamp}$. The bridge rectifier 62, two HEMTs T1 and T2, and the protection unit $D_{clamp}$ are formed on the substrate 91 together. In other words, the LED driver 60c is a monolithic structure, and each unit of the LED driver 60c is formed on a single semiconductor substrate by different processes. The bridge rectifier 62, two HEMTs T1 and T2, and the protection unit $D_{clamp}$ are electrically connected in the same way as described in FIG. 36A. In the embodiment, the four rectifying diodes of the bridge rectifier 62 are formed by four Schottky diodes SBD1, SBD2, SBD3 and SBD4 with multi-finger structures and arrayed on the substrate 91. Two HEMTs T1 and T2 are, for example, the high electron mobility field effect transistors with multi-finger structures, and the protection unit $D_{clamp}$ is a clamping diode with a multi-finger structure, for example. The bridge rectifier 62 is electrically connected to an AC input power source (not shown) by the nodes N, L and between the AC input power source and an LED (not shown). Equivalently, the Schottky diodes SBD1, SBD2, SBD3, and SBD4 in the bridge rectifier 62 are formed by connecting a plurality of small Schottky diodes in parallel. The HEMT with multi-finger structure provides a larger driving current in a limited area of the chip. In an embodiment, each of the Schottky diodes SBD1, SBD2, SBD3 and SBD4 can also be formed by connecting a plurality of diodes in series as shown in FIG. 27. In another embodiment, the HEMTs T1 and T2 are not limited to the depletion mode. One of them can be an enhancement mode (E-mode) and the other is a depletion mode. The details thereof can be referred to FIGS. 29A, 29B, and 30. In another embodiment, the HEMT T1/T2 of the LED driver 60c can be connected to a thermistor. The details thereof can be referred to the description of FIG. 33 to FIG. 35, and not be repeated here.

Figure 39:
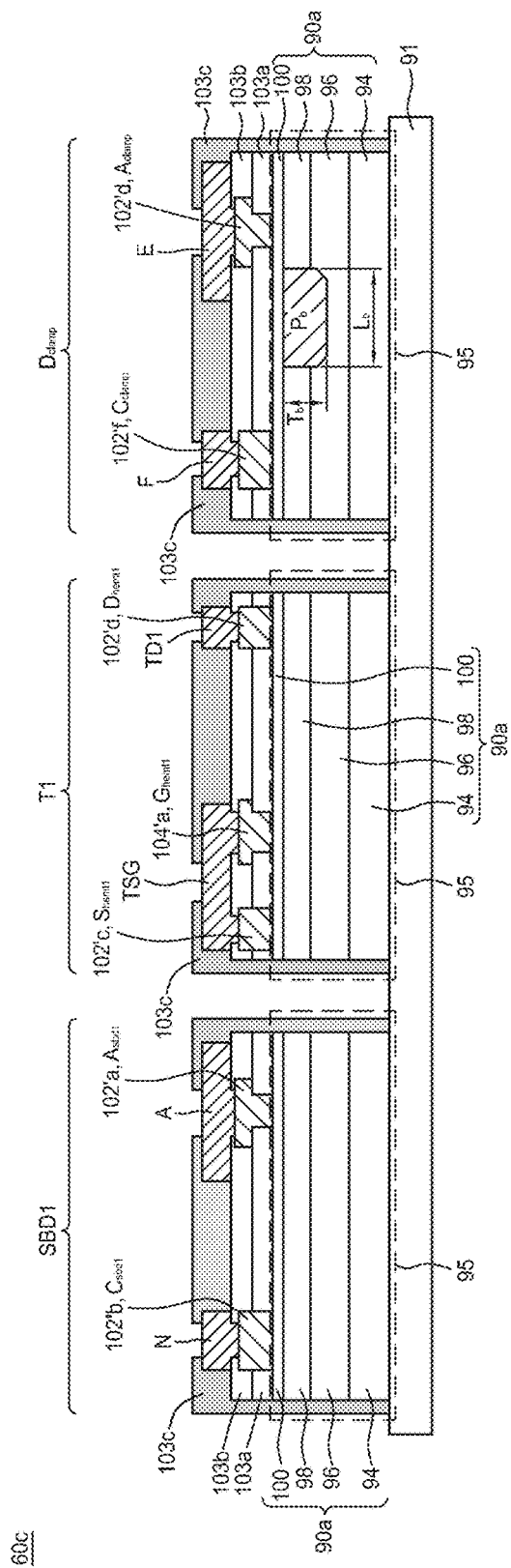
FIG. 39 shows a cross-sectional view of the Schottky diode, the HEMT and the protection unit disclosed in FIG. 38.

Referring to FIG. 38 and FIG. 39 together. FIG. 39 shows a cross-sectional view in the structures of the Schottky diode SBD1, the HEMT T1, and the protection unit $D_{clamp}$ in FIG. 38. As shown above and in FIG. 38, the LED driver 60c includes a bridge rectifier 62 consisted of four Schottky diodes SBD1, SBD2, SBD3, SBD4 arranged in array, two high HEMTs T1, T2, a protection unit $D_{clamp}$, and a plurality of nodes A, C, E, F, N, L, TD1, TD2, TSG. The anodes $A_{sbd1\sim sbd4}$ and the cathodes $C_{sbd1\sim sbd4}$ are respectively formed on the Schottky diodes SBD1, SBD2, SBD3 and SBD4; the drains $D_{hemt1}$ and $D_{hemt2}$, the gates $G_{hemt1}$ and $G_{hemt2}$, and the sources $S_{hemt1}$ and $S_{hemt2}$ are respectively formed on HEMTs T1 and T2; and an anode $A_{clamp}$ and a cathode $C_{clamp}$ are respectively formed on the protection unit $D_{clamp}$. The Schottky diodes SBD1, SBD2, SBD3 and SBD4, the HEMTs T1 and T2, the protection unit $D_{clamp}$ and the plurality of nodes A, C, E, F, N, L, TD1, TD2, and TSG are formed on the substrate 91 together. In the embodiment, since the structures of the Schottky diodes SBD1, SBD2, SBD3 and SBD4 are the same and the structures of the HEMTs T1 and T2 are the same, for the sake of simplicity, the structures of the Schottky diode SBD1 and the HEMT T1 are illustrated respectively in FIG. 39. FIG. 39 is only a schematic illustration of the structure and not an actual structure size and layout. As shown in FIG. 39, the Schottky diode SBD1 on the substrate 91 includes a semiconductor stack 90a, and insulating layers 103a, 103b and an anode $A_{sbd1}$ and a cathode $C_{sbd1}$ on the semiconductor stack 90a. The anode $A_{sbd1}$ and the cathode $C_{sbd1}$ are respectively connected to the nodes A and N; the HEMT T1 on the substrate 91 includes the semiconductor stack 90a and insulating layers 103a, 103b and a source $S_{hemt1}$, a drain $D_{hemt1}$ and a gate $G_{hemt1}$ on the semiconductor stack 90a, wherein the source $S_{hemt1}$ and the gate $G_{hemt1}$ are connected to the node TSG and the drain $D_{hemt1}$ is connected to the node TD1; and the protection unit $D_{clamp}$ on the substrate 91 includes the semiconductor stack 90a, and the insulating layers 103a, 103b and the anode $A_{clamp}$ and the cathode $C_{clamp}$ on the semiconductor stack 90a, wherein the anode $A_{clamp}$ and the cathode $C_{clamp}$ are respectively connected to the nodes E, F.

In the embodiment, the Schottky diode SBD1, the HEMT T1 and the protection unit $D_{clamp}$ are formed on the substrate 91 together, and each includes the same semiconductor stack 90a respectively. Therefore, in the embodiment, when forming the Schottky diode SBD1, the HEMT T1 and the protection unit $D_{clamp}$, the three semiconductor stacks 90a can be formed at the same time, and the three semiconductor stacks 90a can be formed on the same substrate 91, thereby simplifying the production process. In the embodiment, before forming the semiconductor stack 90a, a substrate 91 is first provided. The substrate 91 has a thickness of about 175-1500 μm. The material of the substrate 91 can include a semiconductor material, an oxide material, and/or a metal material. The above-mentioned semiconductor material can include, for example, silicon (Si), silicon carbide (SiC), gallium nitride (GaN), gallium arsenide (GaAs), aluminum nitride (AlN), or the like. The above-mentioned oxide material can include a sapphire. The above-mentioned metal material can include, for example, copper (Cu) or molybdenum (Mo). In addition, the substrate 91 can be a conductive substrate or an insulating substrate when distinguished by the conductivity thereof. The conductive substrate includes a silicon (Si) substrate, a gallium nitride (GaN) substrate, a gallium arsenide (GaAs) or the like. The insulating substrate includes a sapphire substrate, a silicon on insulator (SOI) substrate, an aluminum nitride (AlN) substrate, or the like. In addition, the substrate 91 can be selectively doped therein to change its conductivity so as to form a conductive substrate or a non-conductive substrate. For Example, the silicon substrate can be doped with boron (B), arsenic (As), or phosphorus (P) to make it conductive.

After the substrate 91 is provided, the semiconductor stack 90a is formed on the substrate 91. The semiconductor stack 90a includes a buffer layer 94, a channel layer 96, a high band-gap layer 98, and a cap layer 100. Each layer of the semiconductor stack 90a can be formed on the substrate 91 by epitaxial growth. In addition, before the buffer layer 94 is formed, a nucleation layer (not shown) can be optionally formed on the substrate 91. The nucleation layer has a thickness of about 20 nm to 200 nm. By means of the nucleation layer, the buffer layer 94, the channel layer 96, the high band-gap layer 98 and the cap layer 100c subsequently formed thereon can have better epitaxial quality. The material of the nucleation layer includes, for example, a Group III-V semiconductor material, such as aluminum nitride (AlN), gallium nitride (GaN), or aluminum gallium nitride (AlGaN). The semiconductor stack 90a can be formed on the substrate 91 by metal-organic chemical vapor deposition (MOCVD) or molecular-beam epitaxy (MBE), but not limited thereto. However, the present disclosure is not limited to the epitaxial method. That is, the substrate 91 of the present disclosure is not limited to the growth substrate. In other embodiments, the semiconductor stack 90a can be epitaxially grown on other growth substrate, and then bonded to the substrate 91. The material of the substrate 91 includes a metal, a dielectric material, an insulating material, or a composite material. The bonding method includes gluing, welding, hot pressing, or the like. Alternatively, the semiconductor stack 90a epitaxially formed on a growth substrate is directly bonded to the substrate 91, and then the growth substrate is completely or partially removed so that the semiconductor stack 90a is formed on the substrate 91. Alternatively, the semiconductor stack 90a is first epitaxially grown on another growth substrate, then the growth substrate is reduced in thickness, and the thinned growth substrate and the semiconductor stack 90a thereon are then bonded to the substrate 91, thereby the semiconductor stack 90a formed on a composite substrate composed of the thinned growth substrate and the substrate 91.

After the nucleation layer is formed, the buffer layer 94 is formed thereon. The buffer layer 94 can be an intrinsic GaN doped with carbon (C-doped) as described above. The buffer layer 94 is used so that the channel layer 96 and the high band-gap layer 98 subsequently formed thereon have better epitaxial quality, and the thickness of the buffer layer 94 is about 1 nm~10 µm. The buffer layer 94 can include a single layer or multiple layers. When the buffer layer 94 includes multiple layers, the buffer layer 94 can include a super lattice multilayer or a stack of two or more different materials. The materials of the single-layer or multi-layer buffer layer 94 can include Group III-V semiconductor materials such as aluminum nitride (AlN), gallium nitride (GaN), or aluminum gallium nitride (AlGaN), and can be doped with other elements, such as carbon or iron, in which the doping concentration can be graded along the direction of growth or fixed. In addition, when the buffer layer 94 is a super lattice multilayer, the buffer layer 94 can be multiple epitaxial layers formed by stacking alternately two layers with different materials. The material of the buffer layer 94 can be Group III-V semiconductor material. For example, the buffer layer 94 can include an aluminum nitride layer (AlN) and a gallium aluminum nitride layer (AlGaN) stacked alternately. The sum thickness of the aluminum nitride layer and the gallium nitride layer is about 2 nm to 30 nm, and the overall thickness is about 1 µm to 5 µm.

After the buffer layer 94 is formed, the channel layer 96 and the high band-gap layer 98 are epitaxially formed on the buffer layer 94. The channel layer 96 has a thickness in the range of 50 to 300 nm and a first energy gap, and is formed on the buffer layer 94. The high band-gap layer 98 has a thickness in the range of 20 to 50 nm and a second energy gap which is larger than the first energy gap, and is formed on the channel layer 96. The lattice constant of the high band-gap layer 98 is smaller than that of the channel layer 96. In the embodiment, the channel layer 96 includes indium gallium nitride ($In_xGa_{(1-x)}N$), wherein $0 \leq x < 1$. The material of the high band-gap layer 98 is aluminum gallium nitride ($Al_yGa_{(1-y)}N$), wherein y is between 0.1 and 0.3. The channel layer 96 and the high band-gap layer 98 can be intrinsic semiconductors. In other embodiments, the high band-gap layer 98 can be made of $Al_wIn_zGa_{(1-z)}N$, wherein $0<w<1$ and $0<z<1$. As mentioned previously, a two dimensional electron gas, as a conductive channel, can be formed in the channel layer 96 adjacent to the junction between the channel layer 96 and the high bandgap layer 98. In detail, because the energy band is affected by the spontaneous polarization of the high bandgap layer 98 and the piezoelectric polarization caused by the lattice mismatch between the channel layer 96 and the high band gap layer 98, a part of the energy band lies below the Fermi level and then a two dimensional electron gas can be formed at the junction between the channel layer 96 and the high bandgap layer 98.

After the high-band gap layer 98 is formed on the channel layer 96, the buffer layer 94, the channel layer 96, the high band-gap layer 98 and the cap layer 100 can be patterned to form the mesa 95 by inductively coupled plasma etching or the like, which can be referred to the step 140 in FIG. 14. Before this patterning step, the semiconductor stacks 90 of the Schottky diode SBD1, the HEMT T1 and the protection unit $D_{clamp}$ are connected with each other. Through this patterning step, the semiconductor stacks 90a of the Schottky diode SBD1, the HEMT T1 and the protection unit $D_{clamp}$ can be separated from each other to achieve electrical isolation between the semiconductor stacks 90a. However, the present disclosure is not limited thereto. The formation timing and the formation manner of the mesa 95 can be adjusted according to requirements of the manufacturing process. For example, in another embodiment, while forming the mesa 95, if the buffer layer 94 is a layer with a high electric resistance, only the channel layer 96, the high bandgap layer 98, and the cap layer 100 on the buffer layer 94 need to be etched instead of etching the buffer layer 94 to electrically insulate the semiconductor stacks 90a from each other. In other words, in the above situation, the buffer layer 94 can be completely or partially reserved. In a situation where the Schottky diode SBD1, the HEMT T1 and the protection unit $D_{clamp}$ share the buffer layer 94, the respective semiconductor stack 90a can still be electrically isolated from each other.

In the embodiment, in order to make the protection unit $D_{clamp}$ non-conductive when the DC voltage $V_{DC-IN}$ is less than the reverse conduction voltage $V_{clamp}$ of the protection unit $D_{clamp}$, after forming the high band-gap layer 98 on the channel layer 96, a p-type barrier layer $P_b$ is further formed in the high band-gap layer 98 of the protection unit $D_{clamp}$. The p-type barrier layer $P_b$ totally depletes the 2D-electron gas located in the channel layer 96 and under the barrier layer $P_b$. Thus, when the DC voltage $V_{DC-IN}$ is less than the reverse conduction voltage $V_{clamp}$ of the protection unit $D_{clamp}$, the protection unit $D_{clamp}$ is non-conductive. In the embodiment, the high band-gap layer 98 of the protection unit $D_{clamp}$ is doped to form the p-type barrier layer $P_b$ therein. When the p-type barrier layer $P_b$ is formed in the high band-gap layer 98, the p-type barrier layer $P_b$ changes the position of the Fermi level such that the Fermi level at the p-type barrier layer $P_b$ is moved away from the conductive band to the valence band. Once the Fermi level at the p-type barrier layer $P_b$ is located below the conduction band, the 2D-electron gas located in the channel layer 96 and under the p-type barrier layer $P_b$ is completely depleted. In general, the doping concentration of the p-type barrier layer $P_b$ is positively correlated with the carrier concentration, and the carrier concentration and the thickness of the p-type barrier layer $P_b$ are respectively negatively correlated with the concentration of the 2D-electron gas. For the case where the p-type barrier layer $P_b$ is formed in the high band-gap layer 98 layer, the higher the carrier concentration of the p-type barrier layer $P_b$ or the thicker the thickness $T_b$ of the p-type barrier layer $P_b$, the more the Fermi level at the p-type barrier $P_b$ moves toward the valence band and the lower the concentration of the 2D-electron gas below the p-type barrier layer $P_b$ is. In the embodiment, by making the thickness $T_b$ of the p-type barrier layer $P_b$ larger than or equal to the thickness of the high band-gap layer 98, the Fermi level at the p-type barrier layer $P_b$ is below the conduction band and not overlap with the conduction band so as to completely deplete the 2D-electron gas under the p-type barrier layer $P_b$. Alternatively, by increasing the carrier concentration of the p-type barrier layer $P_b$, the conduction band at the p-type barrier layer $P_b$ does not overlap with the Fermi level so as to completely deplete the 2D-electron gas under the p-type barrier layer $P_b$. In other words, the carrier concentration and the thickness $T_b$ of the p-type barrier layer $P_b$ affect the polarity of the p-type barrier layer $P_b$, thereby changing the band position of the p-type barrier layer $P_b$ such that the distance between the Fermi level and the valence band changes accordingly and the concentration of 2D-electron gas under the p-type barrier layer $P_b$ also changes accordingly.

In addition, the carrier concentration and the length $L_b$ of the p-type barrier layer $P_b$ also affect the width of the depletion region between the p-type barrier layer $P_b$ and the channel layer 96. Since the reverse conduction voltage $V_{clamp}$ of the protection unit $D_{clamp}$ is affected by both the concentration of the 2D-electron gas and the width of the depletion region between the p-type barrier layer $P_b$ and the channel layer 96, the carrier concentration, the length $L_b$, and the thickness $T_b$ of the p-type barrier layer $P_b$ can be adjusted to change the magnitude of the reverse conduction voltage $V_{clamp}$. In detail, the reverse conduction voltage $V_{clamp}$ of the protection unit $D_{clamp}$ is negatively correlated with the carrier concentration of the p-type barrier layer $P_b$ and positively correlated with the length $L_b$ of the p-type barrier layer $P_b$. The lower the carrier concentration or the longer the length $L_b$, the wider the depletion region of the protection unit $D_{clamp}$ is and the higher the reverse conduction voltage $V_{clamp}$ thereof is. The depletion region mentioned here means the region without movable carrier close to the junction between the p-type barrier layer $P_b$ and the channel layer 96. The reverse conduction voltage $V_{clamp}$ of the protection unit $D_{clamp}$ can satisfy the requirement less than the breakdown voltage $V_{break}$ of the HEMT T1 by properly adjusting the carrier concentration and the length $L_b$ of the p-type barrier layer $P_b$. In summary, in the embodiment, since the p-type barrier layer $P_b$ can change the concentration of the 2D-electron gas under the p-type barrier layer $P_b$ and also adjusts the reverse conduction voltage $V_{clamp}$ of the protection unit $D_{clamp}$, by properly adjusting the carrier centration and the length $L_b$ of the p-type barrier layer $P_b$, the reverse conduction voltage $V_{clamp}$ of the protection unit $D_{clamp}$ can be less than the breakdown voltage $V_{break}$ of the HEMT T1, and the protection unit $D_{clamp}$ can be non-conductive when the direct current voltage $V_{DC\text{-}IN}$ is less than the reverse conduction voltage $V_{clamp}$ of the protection unit $D_{clamp}$. The present disclosure is not limited thereto, and the above object can be achieved by other methods. For example, in another embodiment, the p-type barrier layer $P_b$ can be additionally formed on the high bandgap layer 98 of the protection unit $D_{clamp}$ (not shown). As described above, when the p-type barrier layer $P_b$ is formed on the high band-gap layer 98, the p-type barrier layer $P_b$ changes the position of the Fermi level so that the Fermi level at the p-type barrier $P_b$ moves away from the conduction band to the valence band. Once the Fermi level at the p-type barrier layer $P_b$ is below the conduction band, the 2D-electron gas under the p-type barrier layer $P_b$ is completely depleted. In general, the doping concentration of the p-type barrier layer $P_b$ is positively correlated with the carrier concentration, and the carrier concentration of the p-type barrier layer $P_b$ affects the concentration of the 2D-electron gas. Specifically, when the p-type barrier layer $P_b$ layer is formed on the high band-gap layer 98, the thickness of the p-type barrier layer $P_b$ is uncorrelated with the concentration of the 2D-electron gas. The 2D-electron gas in the channel layer 96 and under the p-type barrier layer $P_b$ is completely depleted by mainly adjusting the carrier concentration of the barrier layer $P_b$. The magnitude of the reverse conduction voltage $V_{clamp}$ of the protection unit $D_{clamp}$ can be changed by adjusting the carrier concentration, the thickness $T_b$ and the length $L_b$ of the p-type barrier layer $P_b$. The theorem is as described above and the details are not repeated herein.

After completing the mesa 95, referring to the step 144 described in FIG. 14, by means of the epitaxial growth or sputtering method and the patterning process, the insulating layer 103*a* is respectively formed on the high band-gap layer 98 of the Schottky diode SBD1, on the high band gap layer 98 of the HEMT T1, and on the high band-gap layer 98 of the protection unit $D_{clamp}$ in one process. For example, the insulating layer 103*a* can be epitaxially formed by metal-organic chemical vapor deposition (MOCVD) or molecular-beam epitaxy (MBE). In the embodiment, the insulating layer 103*a* substantially covers the surface of the high band-gap layer 98, which serves to improve the surface leakage current and to protect the surface of the high band-gap layer 98. The material of the insulating layer 103*a* can be an insulating material or a material with high electric resistance, including a nitride insulating material such as silicon nitride ($SiN_x$), an oxide insulating material such as silicon dioxide ($SiO_2$), or a p-type Group III-V semiconductor such as a p-type gallium nitride layer (p-GaN). However, the present disclosure is not limited thereto. Other materials including the same characteristics can substitute. In addition, the position of the insulating layer 103*a* is not limited to the present disclosure.

After the insulating layer 103*a* is formed, in the same process, referring to the step 142 described in FIG. 14, a metal layer (not shown) is respectively formed on the insulating layers 103*b* of the Schottky diode SBD1, the HEMT T1 and the protection unit $D_{clamp}$, and the metal layer is patterned to form a plurality of metal strips 102'*a*, 102'*b*, 102'*c*, 102'*d*, and 102'*e*. In the embodiment, an ohmic contact can be formed between the plurality of metal strips 102'*a*, 102'*b*, 102'*c*, 102'*d*, and 102'*e* and the high band-gap layer 98 by selecting proper material of metal layers, such as titanium/aluminum/titanium/gold, and/or by a process such as thermal annealing. The metal strips 102'a and 102'b serve as the anode $A_{sbd1}$ and the cathode $C_{sbd1}$ of the Schottky diode SBD1. The metal strips 102'c and 102'd serve as the source $S_{hemt1}$ and the drain $D_{hemt1}$ of the HEMT T1. The metal strips 102'e and 102'f serve as the anode $A_{clamp}$ and the cathode $C_{clamp}$ of the protection unit $D_{clamp}$. After the formation of the plurality of electrodes $A_{sbd1}$, $C_{sbd1}$, $S_{hemt1}$, $D_{hemt1}$, $A_{clamp}$ and $C_{clamp}$, referring to the step 146 described in FIG. 14, a metal layer (not shown) is formed on the HEMT T1 and patterned to form the metal strip 104'a. In the embodiment, a Schottky contact can be formed between the metal strip 104'a and the high band-gap layer 98 by selecting proper material of metal layers, such as nickel/gold/platinum. The metal strip 104'a serves as the gate $G_{hemt1}$ of the HEMT T1.

After forming the gate $G_{hemt1}$ described above, an insulating layer 103b can further be formed to cover the high band-gap layer 98 to prevent the high band-gap layer 98 from being deteriorated by moisture and then exerting an electrical influence. In the embodiment, the material of the insulating layer 103b can be referred to the previous description of the insulating layer 103a, and the details are not repeated herein. In addition, in order to facilitate the electrical connection between the aforementioned electrodes and the outside, a plurality of nodes C, N, L, A, TD1, TD2, TSG, E and F can be formed on the substrate 91 as shown in FIG. 38 after the formation of the insulating layer 103b is completed. The nodes C, N, L and A are used to connect to the anodes $A_{sbd1\sim sbd4}$ and the cathodes $C_{sbd1\sim sbd4}$ of the Schottky diodes SBD1, SBD2, SBD3, and SBD4. The nodes TD1 and TD2 are used to respectively connect to the drains $D_{hemt1}$ and $D_{hemt2}$ of the HEMTs T1 and T2. The nodes TSG is used to connect to the source $S_{hemt1}$ and the gate $G_{hemt1}$ of the HEMT T1 and the source $S_{hemt2}$ and the gate $G_{hemt2}$ of the HEMT T2. The nodes E and F are used to respectively connect to the anode $A_{clamp}$ and the cathode $C_{clamp}$ of the protection unit $D_{clamp}$. FIG. 39 only shows the nodes A, N, TD1, TSG, E, and F related to the Schottky diode SBD1, the HEMT T1, and the protection unit $D_{clamp}$. The nodes A and N are respectively connected to the anode $A_{sbd1}$ and the cathode $C_{sbd1}$ of the Schottky diode SBD1. The nodes TSG is connected to the source $S_{hemt1}$ and the gate $G_{hemt1}$ of the HEMT T1. The node TD1 is connected to the drain $D_{hemt1}$ of the HEMT T1. The nodes E and F are respectively connected to the anode $A_{clamp}$ and the cathode $C_{clamp}$ of the protection unit $D_{clamp}$. The structures and formations of Schottky diodes SBD2, SBD3, SBD4 and the HEMT T2 are the same as the structure and formation of Schottky diode SBD1 and the HEMT T1, which can be referred to the description of the Schottky diode SBD1 and the HEMT T1 and not be repeated herein.

In the present disclosure, in order to realize the electrical connection relationship of FIG. 36A, as shown in FIG. 38, the node A is connected to the anode $A_{sbd1}$ of the Schottky diode SBD1 as well as the anode $A_{sbd2}$ of the Schottky diode SBD2. The node N is connected to the cathode $C_{sbd1}$ of the Schottky diode SBD1 as well as the anode $A_{sbd4}$ of the Schottky diode SBD4. The node L is connected to the anode $A_{sbd3}$ of the Schottky diode SBD3 as well as the cathode $C_{sbd2}$ of the Schottky diode SBD2. The node C is connected to the cathode $C_{sbd3}$ of the Schottky diode SBD3 as well as the cathode $C_{sbd4}$ of the Schottky diode SBD4. The node TSG is connected to the source $S_{hmt1}$ and the gate $G_{hemt1}$ of the HEMT T1 as well as the source $S_{hemt2}$ and the gate $G_{hemt2}$ of the HEMT T2. The node TD1 is connected to the drain $D_{hemt1}$ of the HEMT T1. The node TD2 is connected to the drain $D_{hemt2}$ of the HEMT T2. The nodes E and F are respectively connected to the anode $A_{clamp}$ and the cathode $C_{clamp}$ of the protection unit $D_{clamp}$ as described above.

After forming the plurality of nodes A, C, E, F, L, N, TD1, TD2, and TSG, an insulating layer 103c can be optionally formed on the side surface of the mesa 95 and the surfaces of plurality of nodes A, C, E, F, L, N, TD1, TD2, TSG to prevent deterioration of the device due to moisture. The partial surfaces of the nodes A, C, E, F, L, N, TD1, TD2 and TSG can be uncovered by the insulating layer 103c according to the requirements to provide the electrical connection. After the above insulation layer is formed, the LED driver 60c of the present disclosure is completed. In actual operation, referring to FIG. 36A and FIG. 38, one end of the AC input power source (AC-source) is electrically connected to the node L of the bridge rectifier 62, and the other end of the AC input power source (AC-source) is connected to the node N of the bridge rectifier 62; one end of the LED 18 is electrically connected to the nodes TD1 and TD2 of the current drive circuit 66, and the other end of the LED 18 is electrically connected to the node C of the current drive circuit 66; the node TSG of the current drive circuit 66 is electrically connected to the node A of the bridge rectifier 62; the node E of the protection circuit 63 is connected to the node A of the bridge rectifier 62; and the node F the protection circuit 63 is connected to the node C of the bridge rectifier 62.

In summary, the LED driver in accordance with an embodiment of the present disclosure includes a valley-fill circuit, which maintains the minimum voltage of the direct current power source at half of the peak value of the voltage, thereby providing enough voltage to drive the light emitting element to continuously emit light. The LED driver in accordance with another embodiment of the present disclosure includes a protection unit to prevent the HEMT of the current driver in the LED driver from being burned due to the surge voltage and thereby to achieve the effect of protecting the light emitting device. The LED driver in accordance to another embodiment of the present disclosure includes a valley-fill circuit and a protection unit so as to achieve the effect of providing enough voltage to drive the light emitting device to continuously emit light and protecting the light-emitting device. The above descriptions are merely preferred embodiments of the present disclosure, and all equivalent changes and modifications made according to the scope of the claims of the present disclosure shall fall within the scope of the present invention.

What is claimed is:

1. An LED driver for driving an LED, comprising:
    a bridge rectifier comprising a rectifying diode, the bridge rectifier receives and converts an AC input power source to a DC power source having a DC current and a DC voltage;
    a current driver, comprising a constant current source, wherein the bridge rectifier, the current driver and the LED are connected in series, and the current driver limits the magnitude of the DC current to drive the LED; and
    a protection circuit, comprising a protection unit, wherein the protection circuit electrically connects to the current driver and the LED;
    wherein the LED driver comprises a substrate, and the rectifying diode, the constant current source, and the protection unit are formed together on the substrate,
    wherein the rectifying diode, the constant current source, and the protection unit respectively comprises a semiconductor stack, and the semiconductor stack of the rectifying diode, the semiconductor stack of the constant current source, and the semiconductor stack of the protection unit comprise the same structures and material.

2. The LED driver according to claim 1, wherein the semiconductor stack is epitaxially formed on the substrate.

3. The LED driver according to claim 2, wherein the semiconductor stack respectively comprise a buffer layer formed on the substrate, a channel layer formed on the buffer layer, and a high band-gap layer formed on the channel layer.

4. The LED driver according to claim 3, wherein the protection unit further comprises a p-type barrier layer formed on the channel layer.

5. The LED driver according to claim 4, wherein the p-type barrier layer is thicker than the high band-gap layer.

6. The LED driver according to claim 3, wherein the protection unit comprises a clamping diode.

7. The LED driver according to claim 1, wherein the constant current source, the protection unit or the rectifying diode comprises a HEMT with multi-finger structure.

8. The LED driver according to claim 1, wherein the rectifying diode comprises multiple rectifying diodes and the constant current source comprises multiple constant current sources.

9. The LED driver according to claim 8, wherein the multiple rectifying diodes are arranged in an array.

10. The LED driver according to claim 1, wherein when the DC voltage is greater than a predetermined value, the DC current flows to the protection circuit.

11. An LED driver for driving an LED, comprising:
a bridge rectifier comprising a rectifying diode, the bridge rectifier receives and converts an AC input power source to a DC power source having a DC current and a DC voltage;
a current driver, comprising a constant current source, wherein the bridge rectifier, the current driver and the LED are connected in series, and the current driver limits the magnitude of the DC current to drive the LED; and
a protection circuit, comprising a protection unit, wherein the protection circuit electrically connects to the current driver and the LED;
wherein the LED driver comprises a substrate, and the rectifying diode, the constant current source, and the protection unit are formed together on the substrate;
wherein the constant current source, the protection unit or the rectifying diode comprises a HEMT with multi-finger structure.

12. The LED driver according to claim 11, wherein the rectifying diode comprises multiple rectifying diodes and the constant current source comprises multiple constant current sources.

13. The LED driver according to claim 12, wherein the multiple rectifying diodes are arranged in an array.

14. The LED driver according to claim 11, wherein when the DC voltage is greater than a predetermined value, the DC current flows to the protection circuit.

* * * * *